United States Patent
Kaneko et al.

(10) Patent No.: US 12,412,732 B2
(45) Date of Patent: Sep. 9, 2025

(54) PLASMA PROCESSING APPARATUS

(71) Applicant: TOKYO ELECTRON LIMITED, Tokyo (JP)

(72) Inventors: Kazushi Kaneko, Yamanashi (JP); Satoru Kawakami, Yamanashi (JP); Eiki Kamata, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 120 days.

(21) Appl. No.: 18/515,129

(22) Filed: Nov. 20, 2023

(65) Prior Publication Data

US 2024/0186115 A1 Jun. 6, 2024

(30) Foreign Application Priority Data

Dec. 1, 2022 (JP) .................................. 2022-192542

(51) Int. Cl.
*H01J 37/32* (2006.01)

(52) U.S. Cl.
CPC .. *H01J 37/32247* (2013.01); *H01J 37/32238* (2013.01)

(58) Field of Classification Search
CPC ........... H01J 37/32192; H01J 37/32201; H01J 37/32238; H01J 37/32247
See application file for complete search history.

(56) References Cited

U.S. PATENT DOCUMENTS

| | | | | |
|---|---|---|---|---|
| 2003/0178143 A1* | 9/2003 | Perrin | ............... | H01J 37/32192 |
| | | | | 118/723 MW |
| 2005/0160987 A1* | 7/2005 | Kasai | ..................... | H05B 6/705 |
| | | | | 118/723 MW |
| 2006/0150914 A1* | 7/2006 | Yamamoto | .......... | H01J 37/3222 |
| | | | | 118/723 MW |
| 2009/0159214 A1* | 6/2009 | Kasai | ................ | H01J 37/32192 |
| | | | | 422/186.04 |
| 2009/0320756 A1* | 12/2009 | Tanaka | ............... | H01J 37/32697 |
| | | | | 118/723 MW |
| 2011/0018651 A1* | 1/2011 | Ikeda | ....................... | H05H 1/46 |
| | | | | 333/118 |
| 2012/0090782 A1* | 4/2012 | Ikeda | ................. | H01J 37/32293 |
| | | | | 156/345.28 |

(Continued)

FOREIGN PATENT DOCUMENTS

JP 2021-031706 A 3/2021

*Primary Examiner* — Jason M Crawford
(74) *Attorney, Agent, or Firm* — Fenwick & West LLP

(57) ABSTRACT

A plasma processing apparatus comprises a processing chamber accommodating a substrate, and defining a processing space by an upper wall, a side wall, and a lower wall, a microwave generator configured to generate a microwave for generating plasma, a plurality of microwave radiators provided above the upper wall, and configured to radiate the microwave toward the processing chamber, a plurality of microwave transmission windows provided at positions corresponding to the plurality of microwave radiators in the upper wall, and formed of a dielectric, and a plurality of resonator array structures disposed on lower surfaces of the plurality of microwave transmission windows, respectively. The resonator array structures are formed by arranging a plurality of resonators that are capable of resonance with a magnetic field component of the microwave and are smaller in size than a wavelength of the microwave.

11 Claims, 16 Drawing Sheets

(56) References Cited

U.S. PATENT DOCUMENTS

| | | | |
|---|---|---|---|
| 2012/0222816 A1* | 9/2012 | Ikeda | H01J 37/3222 156/345.41 |
| 2012/0247676 A1* | 10/2012 | Fujino | H01J 37/32211 118/723 MW |
| 2012/0299671 A1* | 11/2012 | Ikeda | H05H 1/46 333/248 |
| 2014/0158302 A1* | 6/2014 | Ikeda | H01J 37/32201 156/345.41 |
| 2014/0361684 A1* | 12/2014 | Ikeda | H01J 37/32266 315/34 |
| 2015/0170881 A1* | 6/2015 | Komatsu | H01J 37/32238 118/723 AN |
| 2016/0177448 A1* | 6/2016 | Ikeda | H01J 37/32449 118/723 AN |
| 2016/0222516 A1* | 8/2016 | Ikeda | C23C 16/511 |
| 2016/0284516 A1* | 9/2016 | Ikeda | H01J 37/32192 |
| 2016/0358757 A1* | 12/2016 | Ikeda | H01J 37/32266 |
| 2017/0032933 A1* | 2/2017 | Harada | H01J 37/3222 |
| 2017/0125517 A1* | 5/2017 | Tapily | H10D 62/121 |
| 2017/0309452 A1* | 10/2017 | Fujino | H01J 37/3244 |
| 2018/0114677 A1* | 4/2018 | Komatsu | H01J 37/32192 |
| 2018/0374680 A1* | 12/2018 | Ikeda | H01L 21/67739 |
| 2020/0381224 A1* | 12/2020 | Ikeda | H01J 37/32275 |
| 2020/0388473 A1* | 12/2020 | Ikeda | H01L 21/67253 |
| 2021/0110999 A1* | 4/2021 | Ikeda | H01J 37/3244 |
| 2022/0316065 A1* | 10/2022 | Wada | C23C 16/4404 |
| 2023/0106303 A1* | 4/2023 | Ikeda | H01J 37/32238 427/575 |
| 2024/0186115 A1* | 6/2024 | Kaneko | H01J 37/32247 |
| 2024/0297018 A1* | 9/2024 | Ikeda | H01J 37/32183 |
| 2024/0339300 A1* | 10/2024 | Kaneko | H01J 37/32247 |
| 2024/0339304 A1* | 10/2024 | Kaneko | H01J 37/32238 |

* cited by examiner

PLASMA PROCESSING APPARATUS

CROSS-REFERENCE TO RELATED APPLICATIONS

This application claims priority to Japanese Patent Application No. 2022-192542, filed on Dec. 1, 2022, the entire contents of which are incorporated herein by reference.

TECHNICAL FIELD

The present disclosure relates to a plasma processing apparatus.

BACKGROUND

Japanese Laid-open Patent Publication No. 2021-031706 has described a plasma processing apparatus having a plurality of microwave radiation mechanisms on an upper wall of a processing chamber.

SUMMARY

The present disclosure provides a plasma processing apparatus that can suppress interference between a plurality of microwave radiators.

A plasma processing apparatus according to one aspect of the present disclosure, comprises: a processing chamber accommodating a substrate, and defining a processing space by an upper wall, a side wall, and a lower wall; a microwave generator configured to generate a microwave for generating plasma; a plurality of microwave radiators provided above the upper wall, and configured to radiate the microwave toward the processing chamber; a plurality of microwave transmission windows provided at positions corresponding to the plurality of microwave radiators in the upper wall, and formed of a dielectric; and a plurality of resonator array structures disposed on lower surfaces of the plurality of microwave transmission windows, respectively, and formed by arranging a plurality of resonators that are capable of resonance with a magnetic field component of the microwave and are smaller in size than a wavelength of the microwave.

DETAILED DESCRIPTION

Figure 1:
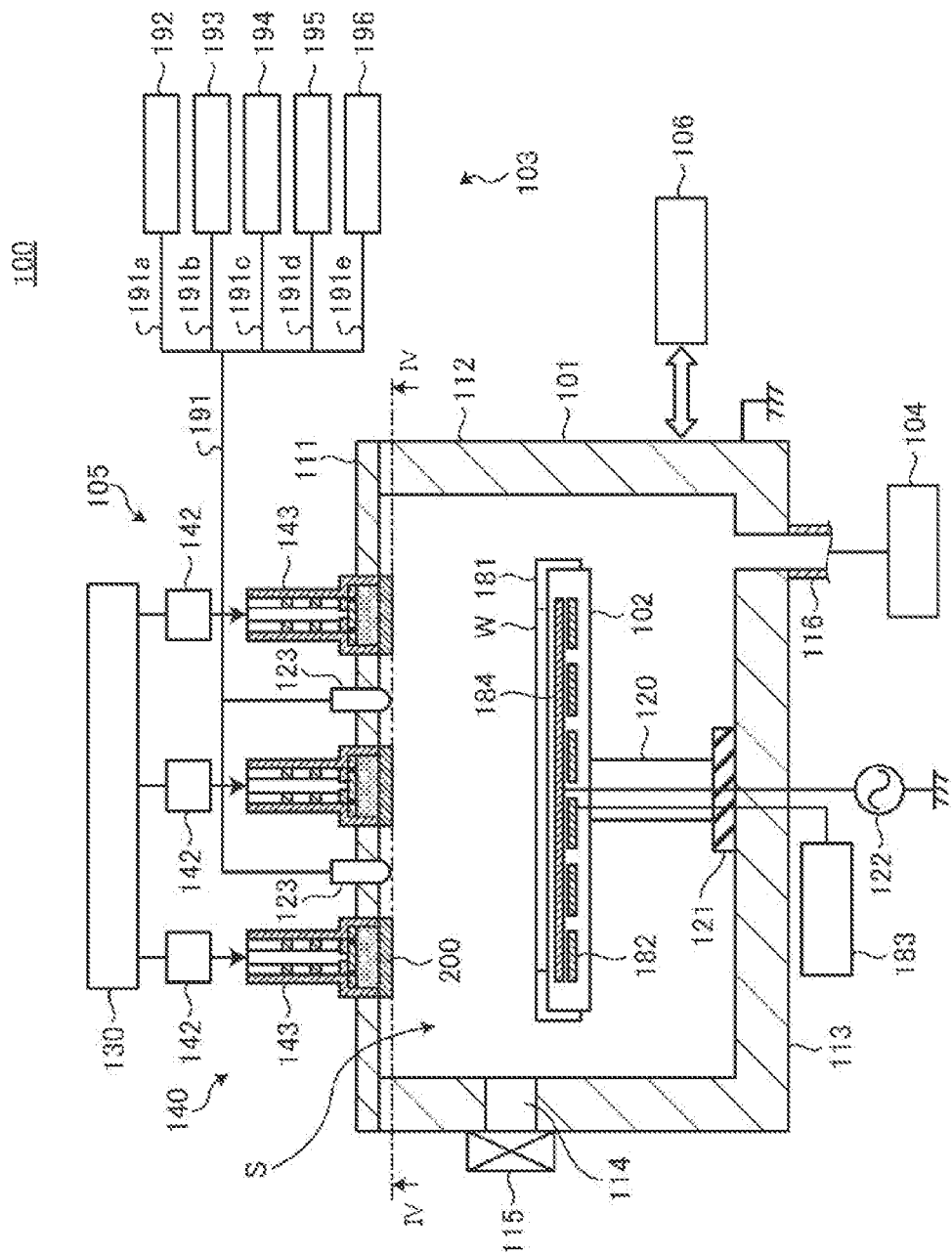
FIG. 1 is a schematic cross-sectional view illustrating an example of the configuration of a plasma processing apparatus according to a first embodiment.

Hereinafter, plasma processing apparatuses according to embodiments of the present disclosure will be described in detail with reference to the accompanying drawings. It should be noted that the present disclosure is not limited to the following embodiments.

In a plasma processing apparatus using a microwave for exciting plasma, the power of the microwave supplied into a processing chamber may be increased to increase the electron density of the plasma. As the power of the microwave supplied into the processing chamber is increased, the electron density of the plasma may be increased.

Here, it is known that the dielectric constant of space in the processing chamber becomes negative, when the electron density of the plasma reaches a specific upper limit by increasing the power of the microwave supplied into the processing chamber. This upper limit of the electron density is appropriately called "cutoff density". Further, a refractive index is known as an index indicating whether the microwave propagates through space. The refractive index N is expressed by the following Equation (1).

$$N=\sqrt{\varepsilon}\sqrt{\mu} \tag{1}$$

where $\varepsilon$: dielectric constant, $\mu$: permeability

The permeability is generally positive. Thus, when the dielectric constant of the space in the processing chamber becomes negative, the refractive index of the space in the processing chamber becomes a pure imaginary number according to the above Equation (1). Thereby, the microwave is attenuated and may not propagate through the space in the processing chamber. As such, when the electron density of the plasma reaches the cutoff density, the power of the microwave is not sufficiently absorbed by the plasma because the microwave may not propagate through the space in the processing chamber. As a result, there is a problem in that increasing the density of plasma generated in the processing chamber over a wide range is inhibited.

Further, in the plasma processing apparatus having a plurality of microwave radiators on an upper wall of the processing chamber, the plasma is generated directly below the upper wall. In such a plasma processing apparatus, when the high-frequency power of the microwave radiator is increased to generate high-density plasma, surface-wave plasma spreads to a neighboring microwave radiator, causing microwaves between the microwave radiators to interfere with each other. When the interference occurs, a plasma load fluctuates rapidly. Therefore, the plasma load may not be matched by a matcher, and a reflected wave is generated, making the plasma unstable. Further, when a reflected wave is generated, power consumed by the plasma decreases even if the power of a traveling wave is constant, so plasma processing speed decreases. Therefore, there is an expectation for a technology that can realize high density plasma over a wide range and suppress interference between the plurality of microwave radiators.

First Embodiment

[Configuration of Plasma Processing Apparatus]

FIG. 1 is a schematic cross-sectional view illustrating an example of the configuration of a plasma processing apparatus according to a first embodiment. The plasma processing apparatus 100 shown in FIG. 1 includes a processing chamber 101, a mounting table 102, a gas supply mechanism 103, an exhaust device 104, a microwave introduction device 105, and a controller 106. The processing chamber 101 accommodates a substrate W. The substrate W is mounted on the mounting table 102. The gas supply mechanism 103 supplies gas into the processing chamber 101. The exhaust device 104 exhausts the inside of the processing chamber 101. The microwave introduction device 105 generates the microwave for generating plasma in the processing chamber 101, and introduces the microwave into the processing chamber 101. The controller 106 controls the operation of each component of the plasma processing apparatus 100.

The processing chamber 101 is formed of a metal material such as aluminum or its alloy, and defines a substantially cylindrical processing space S therein. The processing chamber 101 includes a plate-shaped upper wall 111 and lower wall 113, and a side wall 112 connecting the upper and lower walls. The microwave introduction device 105 is provided on the processing chamber 101, and functions as a plasma generating means that introduces an electromagnetic wave (microwave) into the processing chamber 101 to generate plasma. The microwave introduction device 105 will be described below in detail.

The upper wall 111 includes a plurality of openings into which the microwave radiation mechanism, resonator array structure, and gas introduction portion of the microwave introduction device 105, which will be described later, are inserted. The side wall 112 has a loading/unloading port 114 for loading and unloading the substrate W, which is a target to be processed, into and out from a transfer chamber (not shown) adjacent to the processing chamber 101. The loading/unloading port 114 is opened and closed by a gate valve 115. The lower wall 113 is provided with the exhaust device 104. The exhaust device 104 is provided on an exhaust pipe 116 connected to the lower wall 113, and is provided with a vacuum pump and a pressure control valve. The inside of the processing chamber 101 is exhausted through the exhaust pipe 116 by the vacuum pump of the exhaust device 104. The pressure in the processing chamber 101 is controlled by the pressure control valve.

The mounting table 102 has a disk shape and is formed of ceramics such as AlN. The mounting table 102 is supported by a cylindrical support member 120 which is made of ceramics such as AlN and extends upward from the center of the lower portion of the processing chamber 101. A guide ring 181 is provided on the outer periphery of the mounting table 102 to guide the substrate W. Further, a lifting pin (not shown) for raising and lowering the substrate W is provided in the mounting table 102 to move in and out of the upper surface of the mounting table 102. In addition, a resistance heating type heater 182 is embedded in the mounting table 102, and the heater 182 is supplied with power from a heater power supply 183 to heat the substrate W on the mounting table 102 via the mounting table. A thermocouple (not shown) is inserted into the mounting table 102, and the heating temperature of the substrate W may be controlled to a predetermined temperature in the range of 300 to 1000° C., for example, on the basis of a signal from the thermocouple. Further, an electrode 184 of the same size as the substrate W is embedded above the heater 182 in the mounting table 102, and a high-frequency bias power supply 122 is electrically connected to the electrode 184. A high-frequency bias for attracting ions to the mounting table 102 from the high-frequency bias power supply 122 is applied to the electrode 184. In addition, the high-frequency bias power supply 122 may not be provided depending on the plasma processing characteristics.

The gas supply mechanism 103 serves to introduce a plasma generation gas and a raw gas for forming a target layer to be formed, such as a carbon layer, into the processing chamber 101, and includes a plurality of gas introduction nozzles 123. Each gas introduction nozzle 123 is inserted into the opening formed in the upper wall 111 of the processing chamber 101. A gas supply pipe 191 is connected to each gas introduction nozzle 123. This gas supply pipe 191 is branched into five branch pipes 191a, 191b, 191c, 191d, and 191e. An Ar gas source 192, an $O_2$ gas source 193, a $N_2$ gas source 194, a $H_2$ gas source 195, and a $C_2H_2$ gas source 196 are connected to the branch pipes 191a, 191b, 191c, 191d, and 191e. The Ar gas source 192 supplies Ar gas as a rare gas that is a plasma generation gas. The $O_2$ gas source 193 supplies $O_2$ gas as an oxidizing gas that is a cleaning gas. The $N_2$ gas source 194 supplies $N_2$ gas used as a purge gas. The $H_2$ gas source 195 supplies $H_2$ gas as a reduction gas. The $C_2H_2$ gas source 196 supplies acetylene ($C_2H_2$) gas as a carbon containing gas that is a layer forming raw gas. Further, the $C_2H_2$ gas source 196 may supply another carbon containing gas such as ethylene ($C_2H_4$).

Although not shown in the drawing, the branch pipes 191a, 191b, 191c, 191d, and 191e are provided with a mass flow controller for controlling a flow rate and valves provided before and after the mass flow controller. A shower plate may be further provided to supply $C_2H_2$ gas and $H_2$ gas to a position closer to the substrate W, thus controlling the dissociation of gas. Further, the same effect can be obtained by extending the nozzles supplying these gases downward.

As described above, the microwave introduction device 105 is provided above the processing chamber 101, and functions as a plasma generating means that generates plasma by introducing the electromagnetic wave (microwave) into the processing chamber 101.

Figure 2:
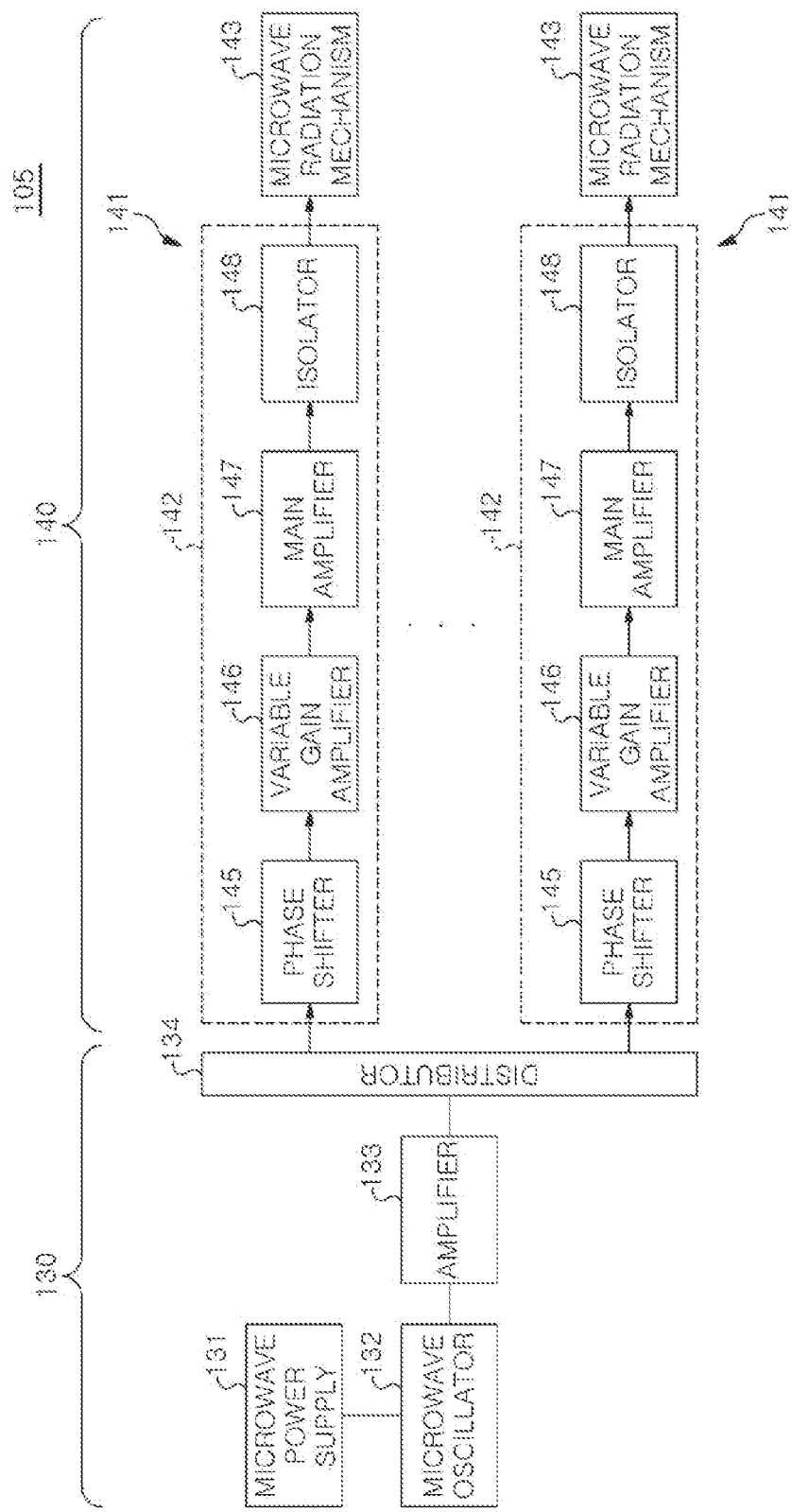
FIG. 2 is a diagram illustrating an example of the configuration of a microwave introduction device according to the first embodiment.

FIG. 2 is a diagram illustrating an example of the configuration of the microwave introduction device according to the first embodiment. As shown in FIGS. 1 and 2, the microwave introduction device 105 includes the upper wall 111 of the processing chamber 101, a microwave output portion 130, and an antenna unit 140. The upper wall 111 functions as an upper plate. The microwave output portion 130 generates the microwave, and distributes and outputs the microwave to a plurality of paths. The antenna unit 140 introduces the microwave output from the microwave output portion 130 into the processing chamber 101 through a resonator array structure 200 that will be described later.

The microwave output portion 130 includes a microwave power supply 131, a microwave oscillator 132, an amplifier 133, and a distributor 134. The microwave oscillator 132 is a solid state, and oscillates the microwave at, for example, 2.45 GHz (e.g., PLL oscillation). In addition, the frequency of the microwave is not limited to 2.45 GHz, and may be in the range of 700 MHz to 10 GHz, such as 860 MHz, 8.35 GHz, 5.8 GHz, or 1.98 GHz. The amplifier 133 amplifies the microwave oscillated by the microwave oscillator 132. The distributor 134 distributes the microwave amplified by the amplifier 133 into a plurality of paths. The distributor 134 distributes the microwave while matching the impedance of an input side with the impedance of an output side.

The microwave output portion 130 may adjust the frequency, power, and bandwidth of the microwave. The microwave output portion 130 may generate the microwave of a single frequency by setting the bandwidth of the microwave to approximately 0, for example. Further, the microwave output portion 130 may generate the microwave (hereinafter appropriately referred to as "wideband microwave") containing a plurality of frequency components belonging to a predetermined frequency bandwidth. The plurality of frequency components may have the same power, and only a median frequency component within a band may have power greater than that of another frequency component. The microwave output portion 130 may adjust the power of the microwave within the range of 0 W to 5000 W, for example. The microwave output portion 130 may adjust the frequency of the microwave or the median frequency of the wideband microwave within the range of 2.3 GHz to 2.5 GHz, for example, and the bandwidth of the wideband microwave may be adjusted within the range of 0 MHz to 100 MHz, for example. In addition, the microwave output portion 130 may adjust the frequency pitch (carrier pitch) of the plurality of frequency components of the wideband microwave within the range of 0 to 25 kHz, for example. The microwave output portion 130 is an example of a microwave generator.

The antenna unit 140 includes a plurality of antenna modules 141. Each of the plurality of antenna modules 141 introduces the microwave distributed by the distributor 134 into the processing chamber 101. The plurality of antenna modules 141 has the same configuration. Each antenna module 141 has an amplifier portion 142 that mainly amplifies and outputs the distributed microwave, and a microwave radiation mechanism 143 that radiates the microwave output from the amplifier portion 142 into the processing chamber 101.

The amplifier portion 142 includes a phase shifter 145, a variable gain amplifier 146, a main amplifier 147, and an isolator 148. The phase shifter 145 changes the phase of the microwave. The variable gain amplifier 146 adjusts the power level of the microwave input into the main amplifier 147. The main amplifier 147 is formed as a solid state amplifier. The isolator 148 separates reflected microwaves that are reflected by an antenna portion of the microwave radiation mechanism 143, which will be described later, and are directed toward the main amplifier 147.

Figure 3:
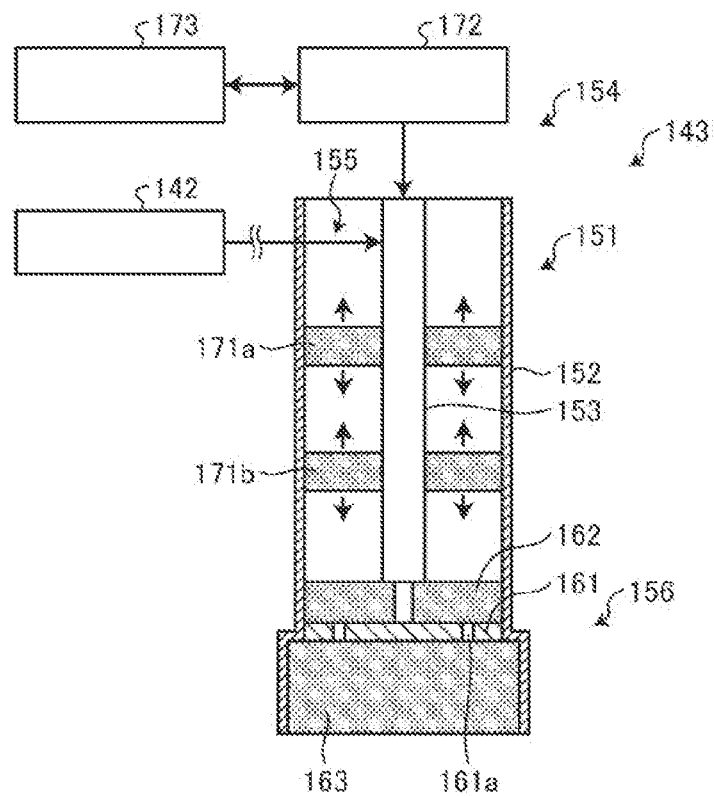
FIG. 3 is a diagram schematically illustrating an example of a microwave radiation mechanism according to the first embodiment.

Here, the microwave radiation mechanism 143 will be described with reference to FIG. 3. FIG. 3 is a diagram schematically illustrating an example of the microwave radiation mechanism according to the first embodiment. As shown in FIG. 1, the plurality of microwave radiation mechanisms 143 are provided on the upper wall 111. Further, as shown in FIG. 3, the microwave radiation mechanism 143 includes a cylindrical outer conductor 152 and an inner conductor 153 that is provided inside the outer conductor 152 to be coaxial with the outer conductor 152. The microwave radiation mechanism 143 includes a coaxial tube 151 having a microwave transmission line between the outer conductor 152 and the inner conductor 153, a tuner 154, a power feeder 155, and an antenna portion 156. The tuner 154 matches the impedance of the load with the characteristic impedance of the microwave power supply 131. The power feeder 155 feeds the microwave amplified from the amplifier portion 142 to the microwave transmission line. The antenna portion 156 radiates the microwave from the coaxial tube 151 into the processing chamber 101. Further, the microwave radiation mechanism 143 is an example of the microwave radiator.

The power feeder 155 introduces the microwave amplified in the amplifier portion 142 by a coaxial cable from the side of the upper end of the outer conductor 152, and radiates the microwave using a feeding antenna, for example. By radiating the microwave, the microwave power is fed to the microwave transmission line between the outer conductor 152 and the inner conductor 153, and the microwave power propagates toward the antenna portion 156.

The antenna portion 156 is provided on the lower end of the coaxial tube 151. The antenna portion 156 includes a disk-shaped planar antenna 161 connected to the lower end of the inner conductor 153, a slow wave material 162 disposed on the upper surface of the planar antenna 161, and a microwave transmitting plate 163 disposed on the lower surface of the planar antenna 161. The microwave transmitting plate 163 is an example of a microwave transmission window. The microwave transmitting plate 163 is fitted into the upper wall 111, and a lower surface thereof faces the resonator array structure 200, which will be described later, and is exposed to the internal space of the processing chamber 101. The planar antenna 161 has a slot 161a formed to penetrate therethrough. The shape of the slot 161a is appropriately set so that the microwave is efficiently radiated. A dielectric may be inserted into the slot 161a.

The slow wave material 162 is formed of a material having a dielectric constant larger than that of vacuum, and allows the phase of the microwave to be adjusted using a thickness thereof, thus maximizing the radiation energy of the microwave. The microwave transmitting plate 163 is also made of a dielectric material, and has a shape that allows the microwave to be efficiently radiated in a TE mode. The microwave transmitted through the microwave transmitting plate 163 generates plasma in space defined in the processing chamber 101 via the resonator array structure 200, which will be described later. As the material forming the slow wave material 162 and the microwave transmitting plate 163, for example, quartz, ceramics, fluorine-based resin such as polytetrafluoroethylene resin, polyimide resin, etc. may be used.

The tuner 154 constitutes a slug tuner. As shown in FIG. 3, the tuner 154 includes slugs 171a and 171b, an actuator 172, and a tuner controller 173. The slugs 171a and 171b are two slugs disposed on a base end side (upper end side) rather than the antenna portion 156 of the coaxial tube 151. The actuator 172 independently drives the two slugs. A tuner controller 173 controls the actuator 172.

The slugs 171a and 171b are plate-shaped and ring-shaped, are made of a dielectric material such as ceramics, and are arranged between the outer conductor 152 and the inner conductor 153 of the coaxial tube 151. For example, the actuator 172 individually drives the slugs 171a and 171b by rotating two screws provided inside the inner conductor 153 and fastened to the slugs 171a and 171b. On the basis of a command from the tuner controller 173, the slugs 171a and 171b are moved vertically by the actuator 172. The tuner controller 173 adjusts the positions of the slugs 171a and 171b so that the impedance at a terminal end becomes 50Ω.

The main amplifier 147, the tuner 154, and the planar antenna 161 are arranged to be close to each other. The tuner 154 and the planar antenna 161 constitute a lumped constant circuit, and also functions as a resonator. Impedance mismatch exists in the attachment part of the planar antenna 161. However, since the tuner 154 directly tunes the plasma load, tuning including plasma may be performed with high precision, and the influence of reflection on the planar antenna 161 may be eliminated.

Figure 4:
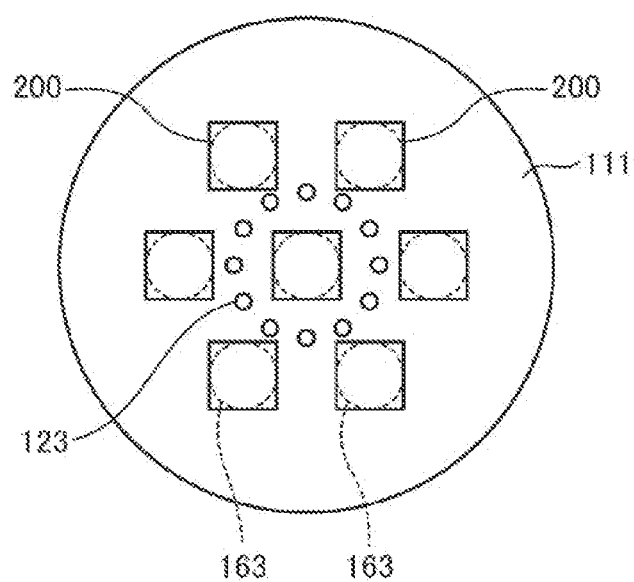
FIG. 4 is a diagram schematically illustrating an example of an upper wall of a processing chamber according to the first embodiment.

FIG. 4 is a diagram schematically illustrating an example of the upper wall of a processing chamber according to the first embodiment. FIG. 4 corresponds to a portion of the processing space S inside the side wall 112 in the cross-section taken along line IV-IV of FIG. 1. As shown in FIG. 4, according to the first embodiment, seven microwave radiation mechanisms 143 are provided, and the corresponding microwave transmitting plates 163 are evenly arranged in a hexagonal close-packed structure. In other words, one of the seven microwave transmitting plates 163 is arranged at the center of the upper wall 111, and six microwave transmitting plates 163 are arranged around the central plate. The seven microwave transmitting plates 163 are arranged so that adjacent microwave transmitting plates 163 are spaced apart from each other at regular intervals. The plurality of gas introduction nozzles 123 of the gas supply mechanism 103 are arranged to surround the central microwave transmitting plate 163. Further, the number of the microwave radiation mechanisms 143 is not limited to seven.

The resonator array structure 200 is provided on the lower surface of the microwave transmitting plate 163, in other words, at a position corresponding to each of the plurality of microwave radiation mechanisms 143 on the upper wall 111. The resonator array structure 200 is formed by arranging a plurality of resonators that are capable of resonance with the magnetic field component of the microwave and are smaller in size than the wavelength of the microwave, and is located in the processing chamber 101. The lower surface of the microwave transmitting plate 163 may be in contact with or spaced apart from the resonator array structure 200.

By locating the resonator array structure 200 in the processing chamber 101, it is possible to cause the microwave supplied to the processing space S by the microwave radiation mechanism 143 to resonate with the plurality of resonators of the resonator array structure 200. By the resonance of the microwave and the plurality of resonators, the microwave may be efficiently supplied to the processing space S of the processing chamber 101, and the permeability of the processing space S may be made negative. When the permeability of the processing space S is negative, the electron density of the plasma generated in the processing space S may reach the cutoff density, and the dielectric constant of the processing space S may be negative. Even in this case, since the refractive index becomes a real number according to the above Equation (1), the microwave may propagate in the processing space S. Thus, even if the electron density of the plasma generated in the processing space S reaches the cutoff density, the microwave may propagate beyond the skin depth of the plasma, and the microwave power is efficiently absorbed by the plasma. As a result, the high-density plasma may be generated over a wide range beyond the skin depth of the plasma. That is, the plasma processing apparatus 100 according to the present embodiment can increase the density of the plasma over a wide range by locating the resonator array structure 200 in the processing chamber 101.

Figure 5:
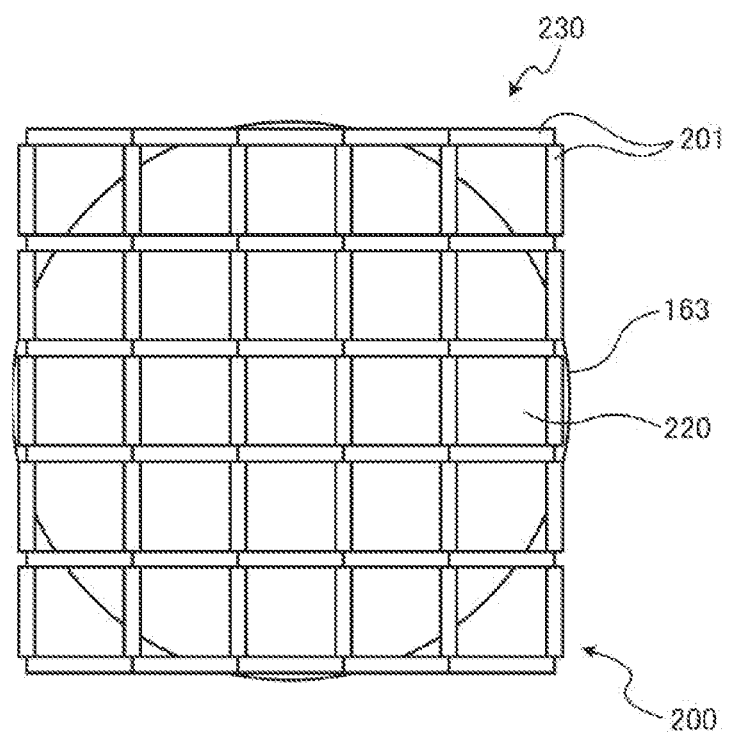
FIG. 5 is a plan view illustrating an example of the configuration of a dielectric window and a resonator array structure according to the first embodiment when seen from below.

Here, the detailed configuration of the resonator array structure 200 will be described with reference to FIGS. 1 and 5. FIG. 5 is a plan view illustrating an example of the configuration of the dielectric window and the resonator array structure according to the first embodiment when seen from below. In FIG. 5, one of the plurality of microwave transmitting plates 163 that are dielectric windows has a disk-shaped lower surface.

The resonator array structure 200 is formed by arranging in a grid shape a plurality of resonators 201 which are capable of resonance with the magnetic field component of the microwave and are smaller in size than the wavelength of the microwave. To be more specific, the plurality of resonators 201 includes at least one resonator among resonators 201A and 201B shown in FIGS. 6 and 7. Each of the plurality of resonators 201 forms a series resonant circuit composed of a capacitor equivalent element and a coil equivalent element. The series resonant circuit is realized by patterning a conductor on a plane. Further, each of the plurality of resonators 201 has a size less than 1/10 of the wavelength of the microwave.

Figure 6:
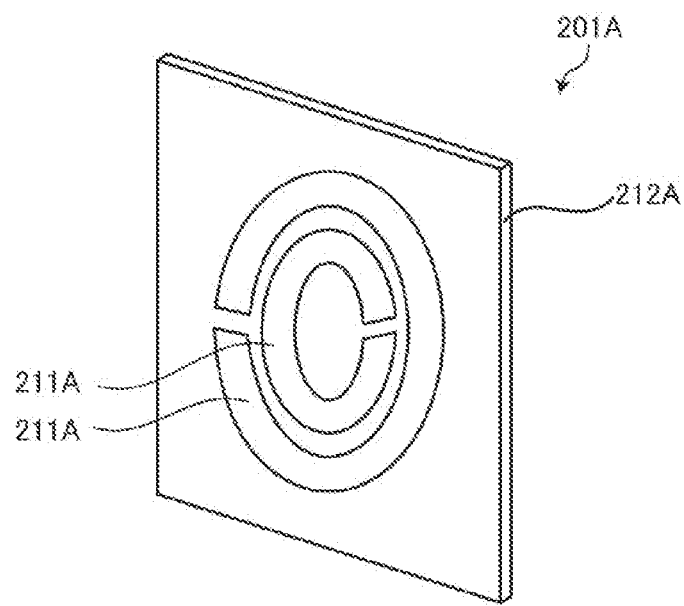
FIG. 6 is a diagram illustrating an example of the configuration of a card-shaped resonator according to the first embodiment.

FIG. 6 is a diagram illustrating an example of the configuration of a card-shaped resonator according to the first embodiment. The card-shaped resonator 201A shown in FIG. 6 has a structure in which two C-shaped ring members 211A are stacked on one surface of a dielectric plate 212A.

The two C-shaped ring members 211A are made of conductors and concentric circles arranged in opposite directions. The capacitor equivalent elements are formed on the opposing surfaces of the inner ring member 211A and the outer ring member 211A or both ends of each ring member 211A, and the coil equivalent element is formed along each ring member 211A. Thereby, the resonator 201A may form a series resonant circuit.

Figure 7:
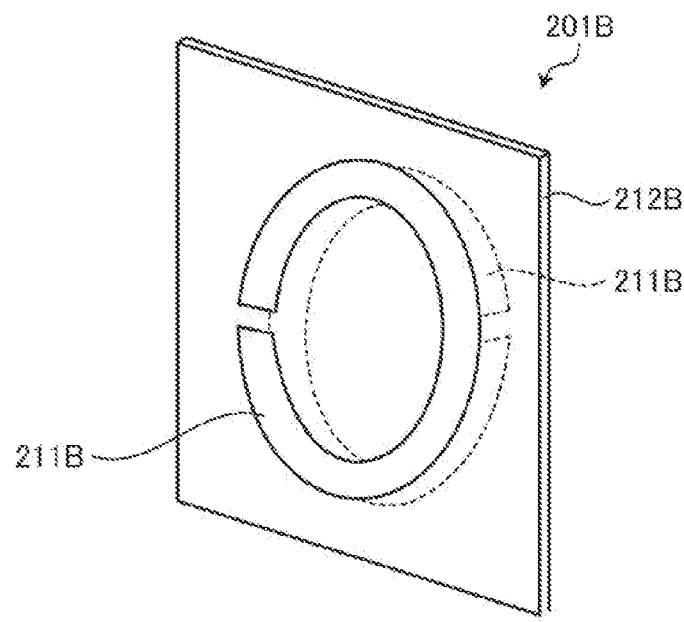
FIG. 7 is a diagram illustrating an example of the configuration of the card-shaped resonator according to the first embodiment.

FIG. 7 is a diagram illustrating an example of the configuration of the card-shaped resonator according to the first embodiment. The card-shaped resonator 201B shown in FIG. 7 has a structure in which two C-shaped ring members 211B made of conductors are arranged, and a dielectric plate 212B is interposed between the ring members 211B arranged adjacent to each other in opposite directions. That is, in the resonator 201B, the dielectric plate 212B is inserted between two C-shaped ring members 211B facing in opposite directions. The capacitor equivalent elements are formed on the opposing surfaces of the two C-shaped ring members 211B or both ends of each ring member 211B, and the coil equivalent element is formed along each ring member 211B. Thereby, the resonator 201B may form a series resonant circuit. The card-shaped resonator 201B may be expressed as being formed into a card shape for each set of two C-shaped ring members 211B.

Figure 8:
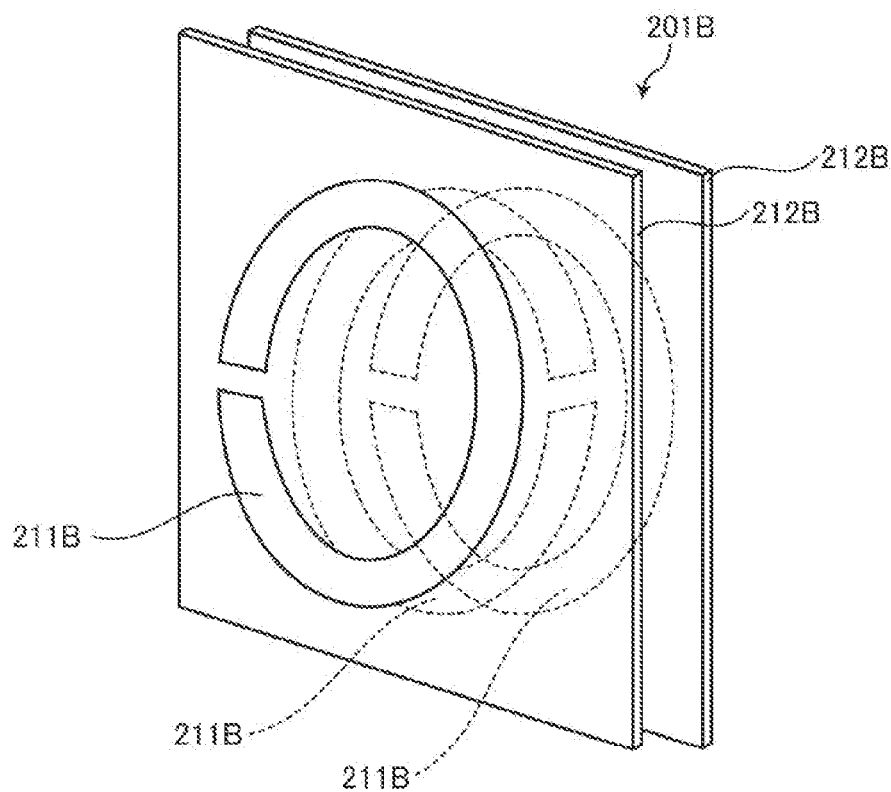
FIG. 8 is a diagram illustrating another example of the configuration of the card-shaped resonator according to the first embodiment.

In the resonator 201B shown in FIG. 7, the arranged number of ring members 211B (hereinafter referred to as a "stacked number") is two, but the stacked number of the ring members 211B may be greater than two. FIG. 8 is a diagram illustrating another example of the configuration of the card-shaped resonator according to the first embodiment. The resonator 201B shown in FIG. 8 has a structure in which N (N≥2) C-shaped ring members 211B made of conductors are arranged and a dielectric plate 212B is interposed between the ring members 211B arranged adjacent to each other in opposite directions. Even with such a structure, the resonator 201B may form a series resonant circuit.

Figure 9:
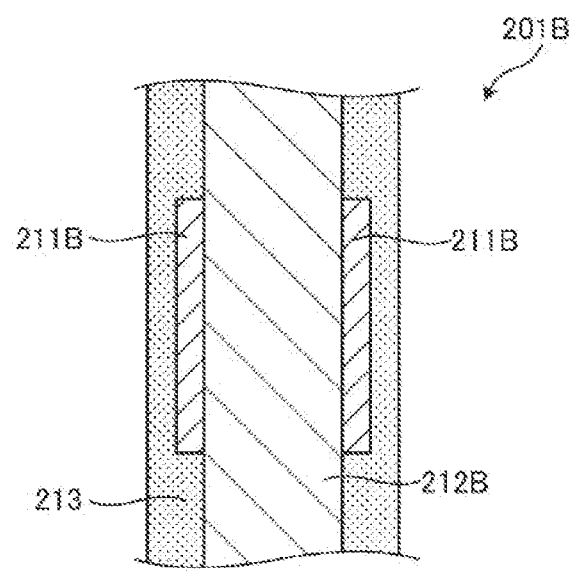
FIG. 9 is a diagram illustrating an example of a cross-section of the card-shaped resonator according to the first embodiment.

Further, an insulating film may be formed on each of the plurality of resonators 201. FIG. 9 is a diagram illustrating an example of a cross-section of the card-shaped resonator according to the first embodiment. FIG. 9 shows a side cross-section of the resonator 201B shown in FIG. 7. An insulating film 213 (an example of the dielectric layer) is formed on the surface of the resonator 201B. The material of the film 213 is, for example, ceramic. The thickness of the film 213 is in the range of 0.001 mm to 2 mm, for example. The insulating film 213 may be formed on each of the plurality of resonators 201, thus suppressing abnormal discharge in each of the plurality of resonators 201. Further, the insulating film 213 may be formed on each of the plurality of resonators 201, thus suppressing the exposure of the ring member 211B to plasma.

The controller 106 includes a processor, a memory, and an input/output interface. The memory stores a program, a process recipe, etc. The processor reads out the program from the memory and executes the program to centrally control each component of the plasma processing apparatus 100 though the input/output interface on the basis of the process recipe stored in the memory.

For example, when plasma is generated in the processing space S, the controller 106 controls such that the microwave supplied to the processing space S by the microwave radiation mechanism 143 resonates with the plurality of resonators 201 in a target frequency band higher than the resonant frequency fr of the plurality of resonators 201. For example, the resonant frequency is a frequency at which the transmission characteristic value (e.g., S21 value) of the plurality of resonators 201 becomes a minimum value.

Figure 10:
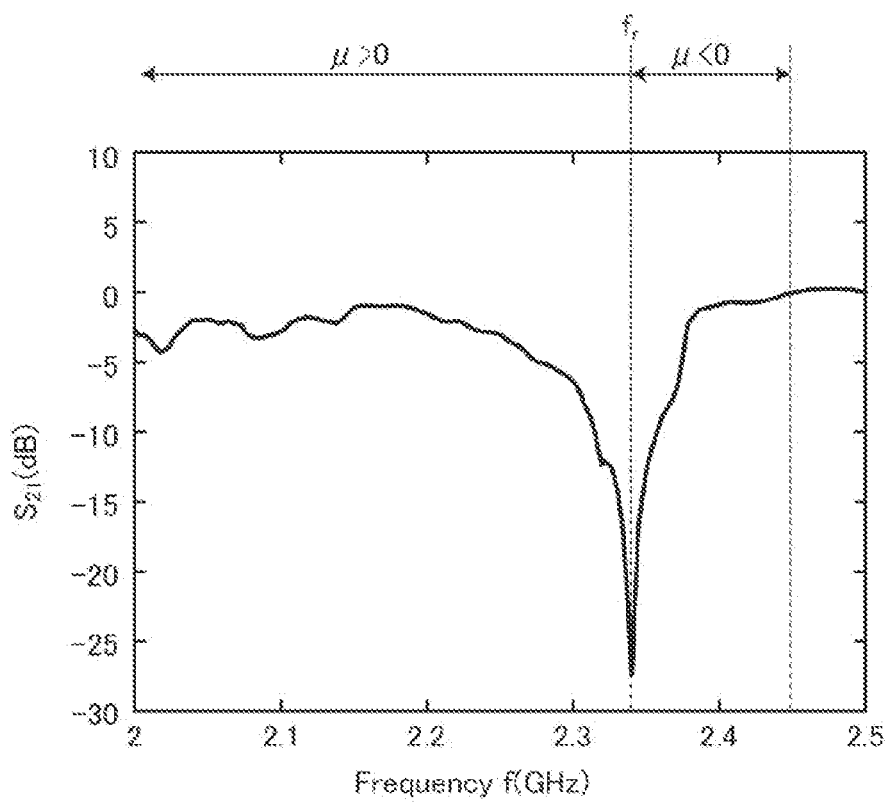
FIG. 10 is a diagram illustrating an example of a relationship between the S21 value of the card-shaped resonator and the frequency of microwaves.

FIG. 10 is a diagram illustrating an example of a relationship between the S21 value of the card-shaped resonator and the frequency of the microwave. When the frequency of the microwave supplied to the processing space S by the microwave radiation mechanism 143 matches the resonant frequency fr (=about 2.35 GHz) of the plurality of resonators 201, the S21 value of the plurality of resonators 201 becomes the minimum value, and resonance between the microwave and the plurality of resonators 201 occurs. The resonance between the microwave and the plurality of resonators 201 is maintained even in a predetermined frequency band (e.g., about 0.1 GHz) higher than the resonant frequency fr of the plurality of resonators 201. In a predetermined frequency band higher than the resonant frequency fr of the plurality of resonators 201, both the dielectric constant and the permeability of the processing space S may be made negative due to the resonance between the microwave and the plurality of resonators 201. As can be seen from the above Equation (1), the microwave may propagate in the processing space S. The target frequency band in this embodiment is set to a predetermined frequency band (e.g., about 0.1 GHz) higher than the resonant frequency fr of the plurality of resonators 201. For example, the target frequency band is preferably within 0.05 times the resonant frequency fr of the plurality of resonators 201. It should be noted that the resonant frequency fr of the card-shaped resonator 201 can be measured using, for example, a vector network analyzer in which a transmission and reception antenna is arranged in a direction parallel to the ring member 211B of the card-shaped resonator 201B.

Regarding the propagation of the electromagnetic wave to the plurality of resonators, the relationship between the resonant frequency, the refractive index, the dielectric constant, and the permeability has been reported by, for example, "Electromagnetic parameter retrieval from inhomogeneous metamaterials" in "PHYSICAL REVIEW E 71, 036617 (2005)" by D. R. Smith, D. C. Vier, Th. Koschny and C. M. Soukoulis.

In this way, even if the electron density of the plasma reaches the cutoff density by causing the microwave and the plurality of resonators 201 to resonate in the target frequency band higher than the resonant frequency fr of the plurality of resonators 201, the microwave may propagate beyond the skin depth of the plasma. Thus, the plasma may efficiently absorb the power of the microwave. As a result, the high-density plasma may be generated over a wide range beyond the skin depth of the plasma. That is, in the plasma processing apparatus 100 according to the present embodiment, the high-density plasma can be realized over a wide range by causing the microwave to resonate with the plurality of resonators 201 in a target frequency band higher than the resonant frequency fr of the plurality of resonators 201.

[Arrangement of Multiple Resonators]

Next, the arrangement of the plurality of resonators 201 in the resonator array structure 200 will be described. As shown in FIG. 5, in the resonator array structure 200, the card-shaped resonators 201 are arranged in a grid shape. In the following description, the resonator array structure 200 may be referred to as a metamaterial 200, and the card-shaped resonator 201 may be referred to as a meta-atom 201. In the example of FIG. 5, meta-atoms 201 are arranged so that cells 220 surrounded by the meta-atoms 201 are formed in five columns in an X-axis direction and in five rows in a Y-axis direction. In other words, the cells 220 are arranged in a 5×5 square array 230. In the array 230, the diameter of the microwave transmitting plate 163 and the length of one side of the metamaterial 200 are substantially equal to each other. Therefore, except for some cell 220 (1st row and 3rd column, 3rd row and 1st column, 3rd row and 5th column, 5th row and 3rd column), the cells 220 in a peripheral portion are arranged across the microwave transmitting plate 163 and the upper wall 111. As such, when some cells 220 of the resonator array structure 200 are arranged across the microwave transmitting plate 163 and the upper wall 111, the upper wall 111 is preferably a dielectric so as to propagate the microwave.

According to this embodiment, it is possible to prevent the plasma from spreading in the horizontal direction from the metamaterial 200 by disposing the metamaterial 200 on the lower surface of the microwave transmitting plate 163. In other words, since the plasma is confined in the cell 220 of the metamaterial 200, interference between neighboring microwave radiation mechanisms 143 may be suppressed. Further, it is possible to suppress the plasma from spreading to the side wall 112 or the gas introduction nozzle 123. Therefore, contamination of aluminum, yttrium, etc. due to damage to the side wall 112 or abnormal discharge near the gas introduction nozzle 123 may be suppressed. Further, a process processing speed can be stabilized by stabilizing plasma discharge. Although not shown in the drawing, the plurality of meta-atoms 201 may be arranged on a base plate formed of a dielectric material, and may be the metamaterial 200 including the base plate. In this case, the metamaterial 200 may be easily attached to the upper wall 111.

[Modifications 1 to 3 of Resonator Array Structure]

Figure 11:
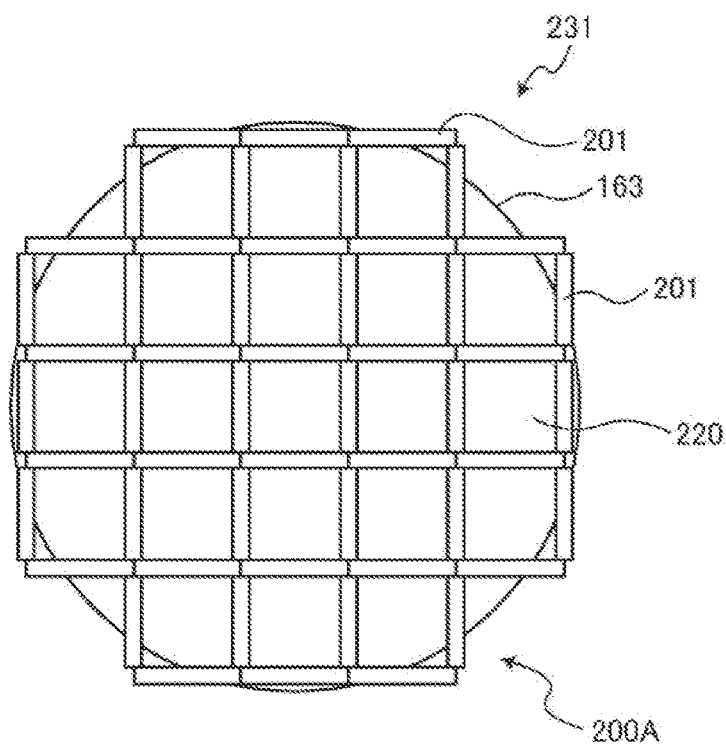
FIG. 11 is a diagram illustrating an example of the arrangement of card-shaped resonators according to modification 1.

Here, modifications in the arrangement of the meta-atom 201 will be described as modifications 1 to 3 in the arrangement of the resonator array structure (metamaterial) 200. FIG. 11 is a diagram illustrating an example of the arrangement of card-shaped resonators according to modification 1. The metamaterial 200A shown in FIG. 11 has an array 231 obtained by removing four corner cells 220 from the array 230 shown in FIG. 5. In the array 231, a portion of the microwave transmitting plate 163 is located outside the metamaterial 200A. Further, in the array 231, some of the cells 220 of the peripheral portion (1st row and 2nd column, 1st row and 4th column, 2nd row and 1st column, 2nd row and 5th column, 4th row and 1st column, 4th row and 5th column, 5th row and 2nd column, and 5th row and 4th column) are arranged across the microwave transmitting plate 163 and the upper wall 111.

Figure 12:
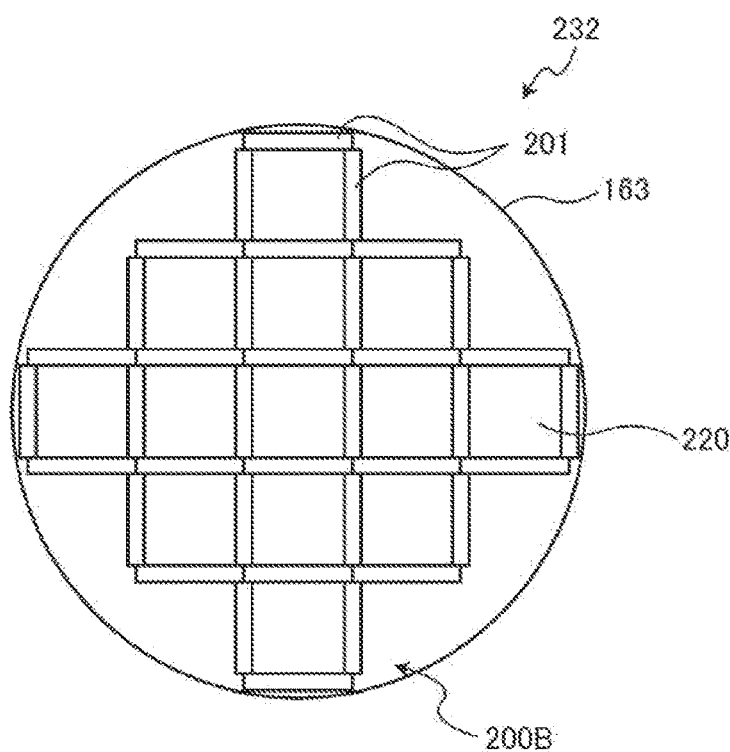
FIG. 12 is a diagram illustrating an example of the arrangement of card-shaped resonators according to modification 2.

FIG. 12 is a diagram illustrating an example of the arrangement of card-shaped resonators according to modification 2. The metamaterial 200B shown in FIG. 12 has an array 232 obtained by further removing some of the cells 220 of the peripheral portion (1st row and 2nd column, 1st row and 4th column, 2nd row and 1st column, 2nd row and 5th column, 4th row and 1st column, 4th row and 5th column, 5th row and 2nd column, and 5th row and 4th column) from the array 231 shown in FIG. 11. In the array 231, a portion of the microwave transmitting plate 163 is located outside the metamaterial 200B. In the array 232, there is no cell 220 arranged across the microwave transmitting plate 163 and the upper wall 111.

Figure 13:
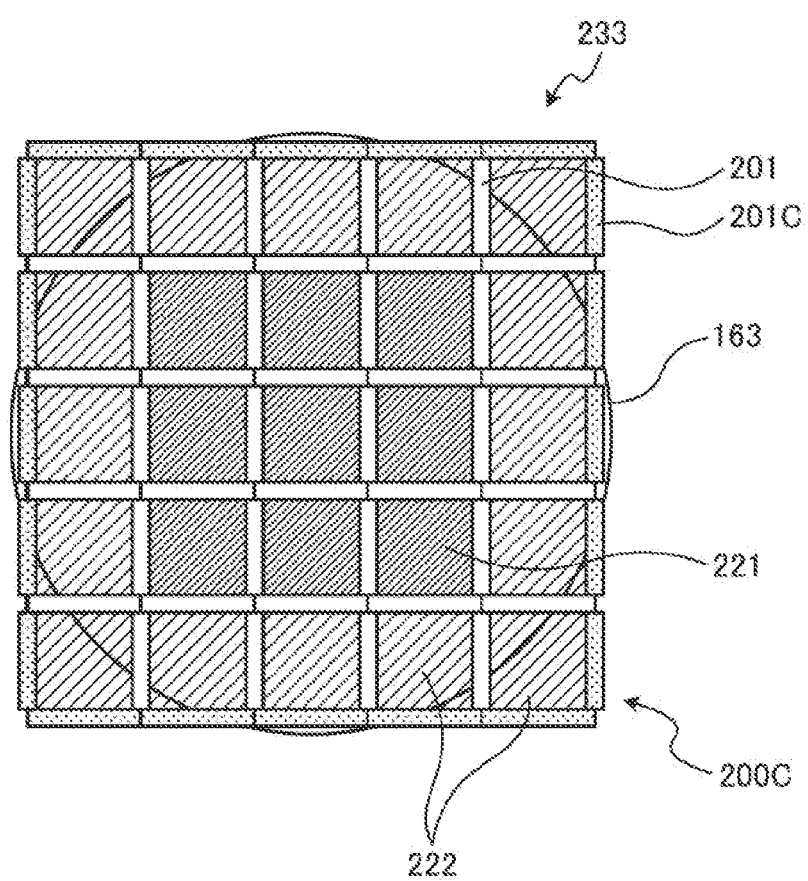
FIG. 13 is a diagram illustrating an example of the arrangement of card-shaped resonators according to modification 3.

FIG. 13 is a diagram illustrating an example of the arrangement of card-shaped resonators according to modification 3. The metamaterial 200C shown in FIG. 13 has an array 233 in which the outermost meta-atom 201 of the array 230 shown in FIG. 5 is replaced with a (non-resonant) meta-atom 201C having a resonant frequency fr different from that of the meta-atom 201. In the array 233, for example, the meta-atom 201 has a resonant frequency fr (=about 2.35 GHz). Further, for example, the meta-atom 201C has a resonant frequency fr (=about 2.15 GHz or about 2.55 GHz) that is a predetermined frequency (e.g., ±0.2 GHz) away from the resonant frequency fr of the meta-atom 201. In the array 233, there are a cell 221 surrounded on all sides by the meta-atoms 201 and a cell 222 surrounded on one or two sides by the meta-atoms 201C. Since the number of meta-atoms 201 that resonate with the frequency output from the microwave output portion 130 in the cell 222 is smaller than that in the cell 221, the plasma density in the cell 222 is lower than that in the cell 221, and it is possible to suppress plasma from spreading to the outside of the metamaterial 200C.

Second Embodiment

In the above-described first embodiment, the individual metamaterial 200 is placed for each of the plurality of microwave transmitting plates 163. However, the plurality of metamaterials 200 may be integrated as one upper plate. This will be described as a second embodiment. Since the plasma processing apparatus of the second embodiment is the same as that of the above-described first embodiment except for the configuration of the upper plate in which the metamaterial 200 is integrated, a duplicated description of the configuration and operation will be omitted.

Figure 14:
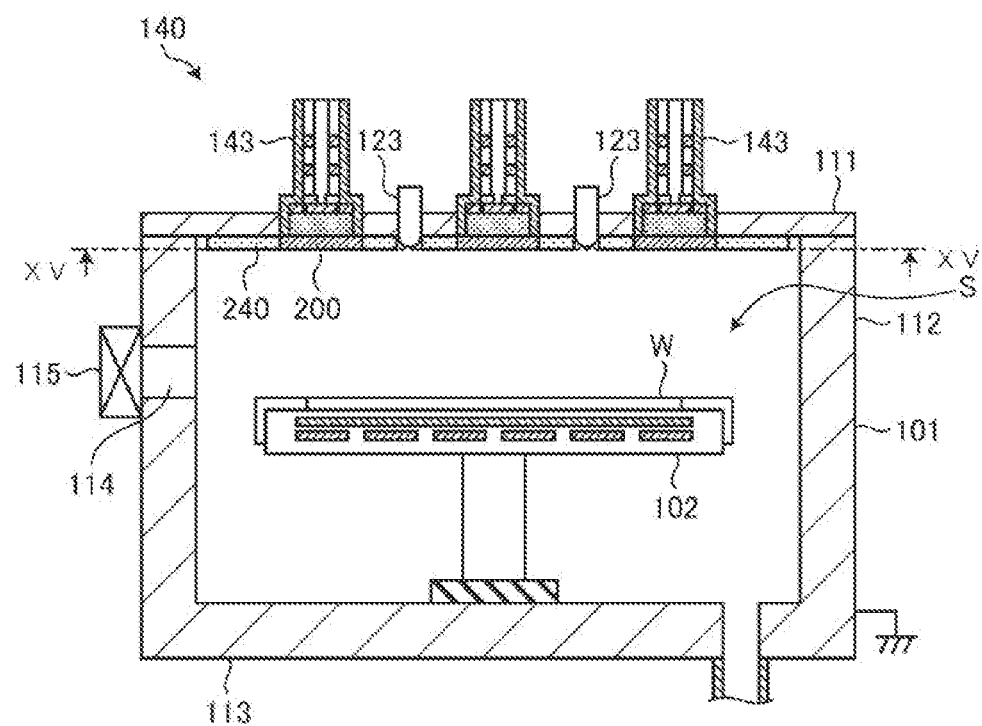
FIG. 14 is a schematic cross-sectional view illustrating an example of the configuration of a plasma processing apparatus according to a second embodiment.
Figure 15:
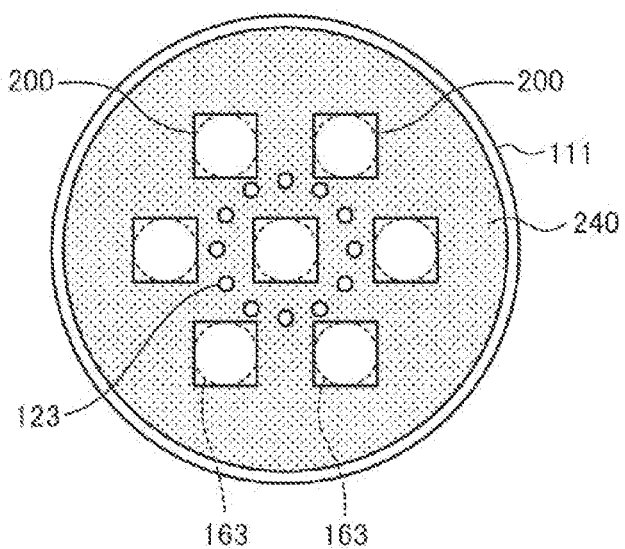
FIG. 15 is a diagram schematically illustrating an example of an upper wall of a processing chamber according to the second embodiment.

FIG. 14 is a schematic cross-sectional view illustrating an example of the configuration of a plasma processing apparatus according to a second embodiment. FIG. 15 is a diagram schematically illustrating an example of an upper wall of a processing chamber according to the second embodiment. FIG. 15 corresponds to a portion of the processing space S inside the side wall 112 in the cross-section taken along line XV-XV of FIG. 14. As shown in FIGS. 14 and 15, the resonator array structure 200 is provided on the lower surface of the microwave transmitting plate 163, that is, at a position corresponding to each of the plurality of microwave radiation mechanisms 143 on the upper wall 111. Each resonator array structure 200 is embedded and integrated into the upper plate 240. The upper plate 240 is formed of a dielectric (insulator) such as quartz or alumina. Further, a hole is provided in the upper plate 240 at a position corresponding to the gas introduction nozzle 123 so that gas may be introduced into the processing space S. In this way, each resonator array structure 200 may be easily installed on the upper wall 111 by forming each resonator array structure 200 integrally with the upper plate 240.

Third Embodiment

In the above-described first embodiment, the cells 220 of the peripheral portion are arranged across the microwave transmitting plate 163 and the upper wall 111. However, all cells may be located in a range corresponding to the microwave transmitting plate 163. This will be described as a third embodiment. Since the plasma processing apparatus of the third embodiment is the same as that of the above-described first embodiment except for the size and arrangement of the metamaterial, a duplicated description of the configuration and operation will be omitted.

Figure 16:
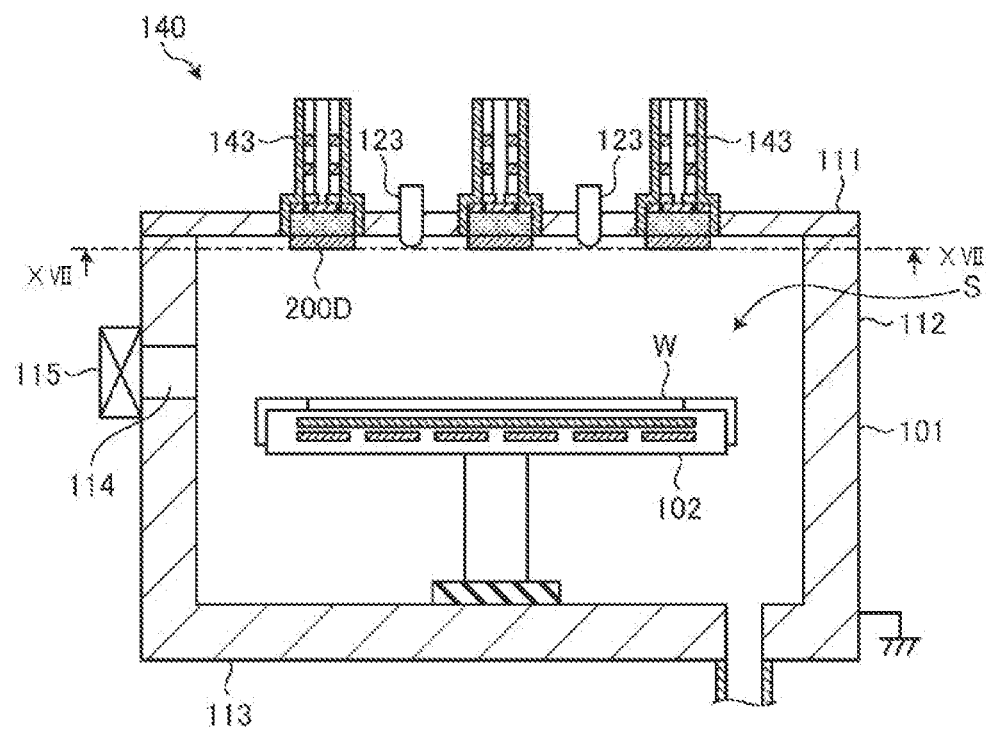
FIG. 16 is a schematic cross-sectional view illustrating an example of the configuration of a plasma processing apparatus according to a third embodiment.
Figure 17:
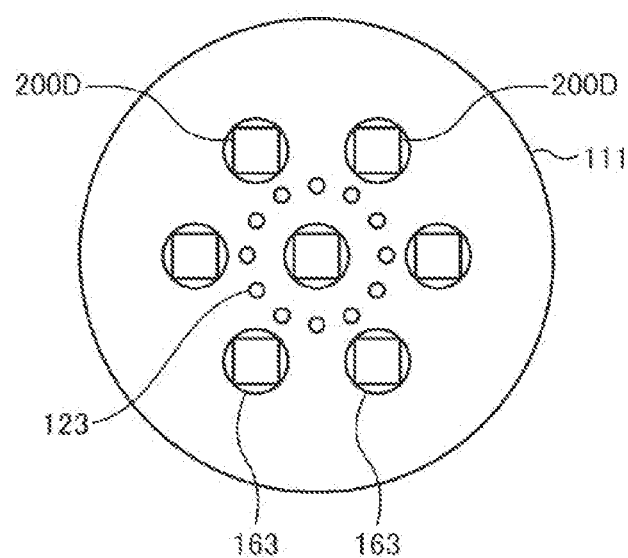
FIG. 17 is a diagram schematically illustrating an example of an upper wall of a processing chamber according to the third embodiment.

FIG. 16 is a schematic cross-sectional view illustrating an example of the configuration of a plasma processing apparatus according to a third embodiment. FIG. 17 is a diagram schematically illustrating an example of an upper wall of a processing chamber according to the third embodiment. FIG. 17 corresponds to a portion of the processing space S inside the side wall 112 in the cross-section taken along line XVII-XVII of FIG. 16. As shown in FIGS. 16 and 17, the resonator array structure (metamaterial) 200D is provided on the lower surface of the microwave transmitting plate 163, that is, at a position corresponding to each of the plurality of microwave radiation mechanisms 143 on the upper wall 111.

Figure 18:
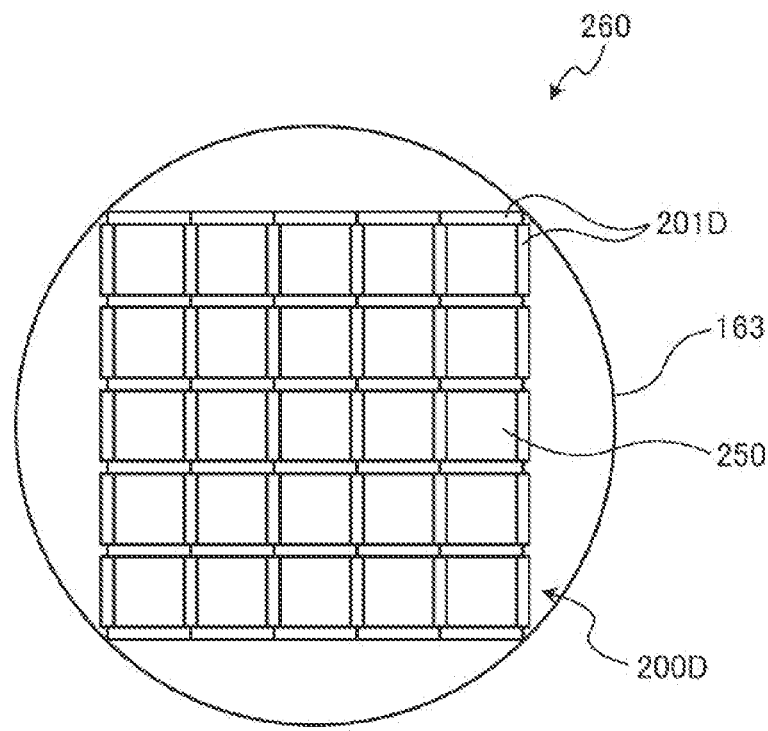
FIG. 18 is a plan view illustrating an example of the configuration of a dielectric window and a resonator array structure according to the third embodiment when seen from below.

FIG. 18 is a plan view illustrating an example of the configuration of a dielectric window and a resonator array structure according to the third embodiment when seen from below. In FIG. 18, the lower surface of one microwave transmitting plate 163 among the plurality of microwave transmitting plates 163, which are dielectric windows, is shown in a disk shape. As shown in FIG. 18, the meta-atoms 201D are arranged in the resonator array structure 200D such that the cells 250 surrounded by the meta-atoms 201D are formed in five columns in the X-axis direction and five rows in the Y-axis direction. In other words, the cells 250 are arranged in a 5×5 square array 260. In the array 260, the length of the diagonal line of the rectangle of the metamaterial 200D is equal to or less than the diameter of the microwave transmitting plate 163. Therefore, all the cells 250 are within the range of the microwave transmitting plate 163. In this way, when all the cells 250 of the resonator array structure 200D are within the range of the microwave transmitting plate 163, the upper wall 111 may be a conductor of aluminum or the like. Furthermore, the meta-atom 201D is smaller in size than the meta-atom 201 of the first embodiment.

[Modifications 4 to 6 of Resonator Array Structure]

Figure 19:
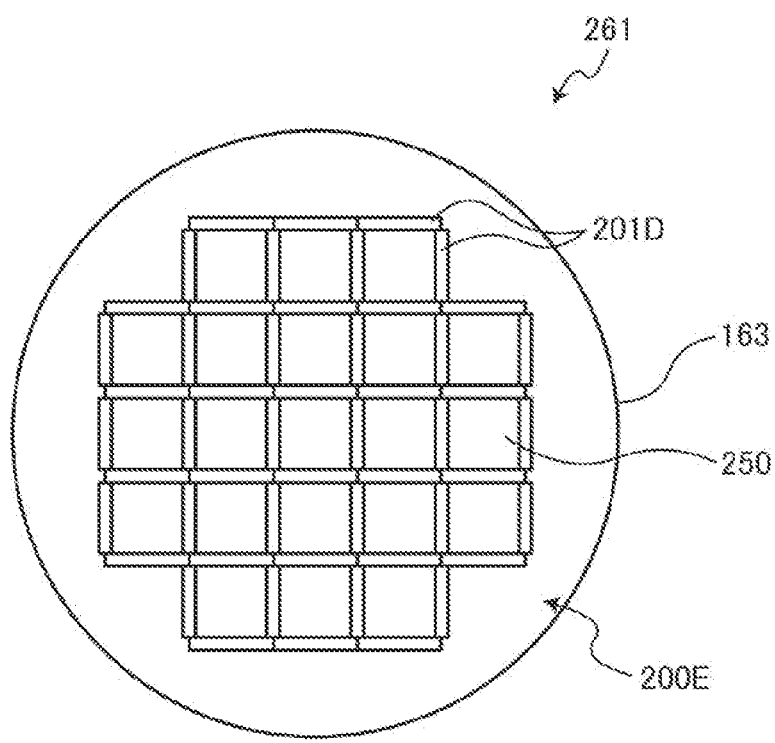
FIG. 19 is a diagram illustrating an example of the arrangement of card-shaped resonators according to modification 4.

Here, modifications in the arrangement of the meta-atom 201D will be described as modifications 4 to 6 in the arrangement of the resonator array structure (metamaterial) 200. FIG. 19 is a diagram illustrating an example of the arrangement of card-shaped resonators according to modification 4. The metamaterial 200E shown in FIG. 19 has an array 261 obtained by removing four corner cells 250 from the array 260 shown in FIG. 18. Since there are no cells 250 at four corners that are closet to the outer periphery of the microwave transmitting plate 163 in the array 261, the plasma density between the cells 250 may be made uniform.

Figure 20:
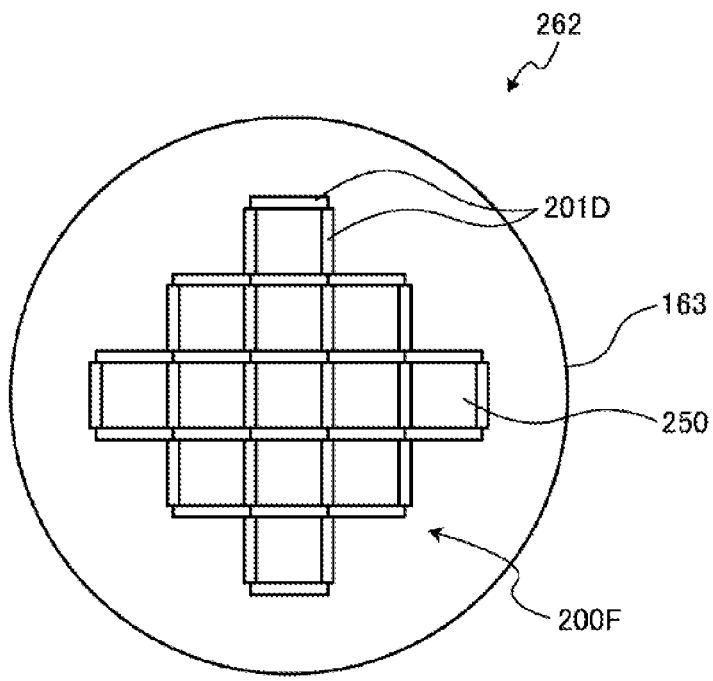
FIG. 20 is a diagram illustrating an example of the arrangement of card-shaped resonators according to modification 5.

FIG. 20 is a diagram illustrating an example of the arrangement of card-shaped resonators according to modification 5. The metamaterial 200F shown in FIG. 20 has an array 262 obtained by further removing some of the cells 250 of the peripheral portion (1st row and 2nd column, 1st row and 4th column, 2nd row and 1st column, 2nd row and 5th column, 4th row and 1st column, 4th row and 5th column, 5th row and 2nd column, and 5th row and 4th column) from the array 261 shown in FIG. 19. Since the array 262 has no cells 250 closer to the outer periphery of the microwave transmitting plate 163 than in the array 261, the plasma density between the cells 250 may be made more uniform than in the array 261.

Figure 21:
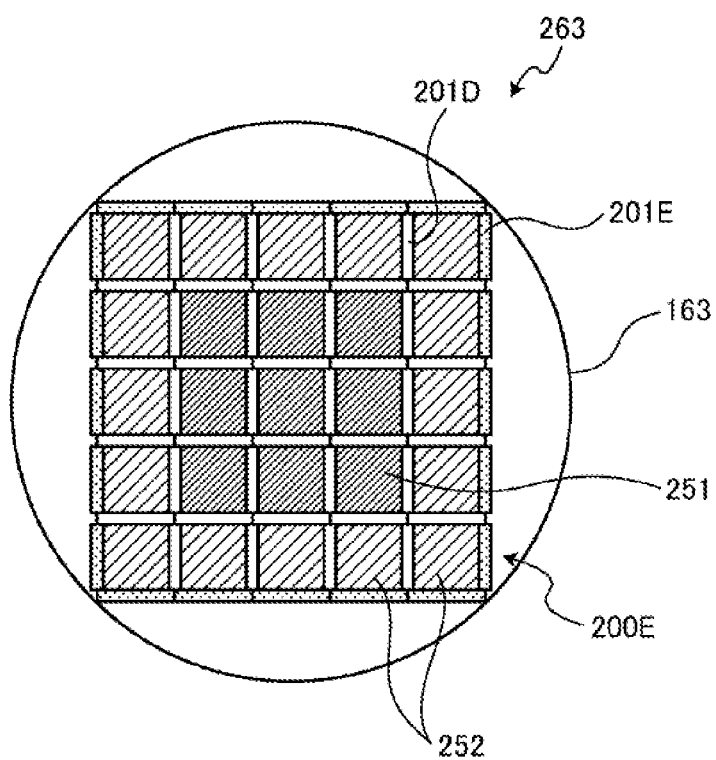
FIG. 21 is a diagram illustrating an example of the arrangement of card-shaped resonators according to modification 6.

FIG. 21 is a diagram illustrating an example of the arrangement of card-shaped resonators according to modification 6. The metamaterial 200E shown in FIG. 21 has an array 263 in which the outermost meta-atom 201D of the array 260 shown in FIG. 18 is replaced with a meta-atom 201E (non-resonant) having a resonant frequency fr different from that of the meta-atom 201D. In the array 263, for example, the meta-atom 201D has a resonant frequency fr (=about 2.35 GHz). Further, for example, the meta-atom 201E has a resonant frequency fr (=about 2.15 GHz or about 2.55 GHz) that is a predetermined frequency (e.g., ±0.2 GHz) away from the resonant frequency fr of the meta-atom 201D. In the array 263, there are a cell 251 surrounded on all sides by the meta-atoms 201D and a cell 252 surrounded on one or two sides by the meta-atoms 201E. Since the number of meta-atoms 201D in the cell 252 that resonate with the frequency output from the microwave output portion 130 is smaller than that in the cell 251, the plasma density in the cell 252 is lower than that in the cell 251.

Fourth Embodiment

In the above-described modifications 3 and 6, the outermost meta-atoms of the metamaterials 200C and 200E are replaced with meta-atoms 201C and 201E that are non-resonant with respect to the frequency output from the microwave output portion 130. In the plasma processing apparatus where the gas introduction nozzle is located in the center cell of the metamaterial, the center cell may be formed of non-resonant meta-atoms, thus preventing the plasma from spreading to the gas introduction nozzle. This will be described as a fourth embodiment. Since the plasma processing apparatus of the fourth embodiment is the same as that of the above-described first embodiment except that there is only one microwave radiation mechanism 143 and the gas introduction nozzle is provided in the center of the upper wall 111, a duplicated description of the configuration and operation will be omitted.

Figure 22:
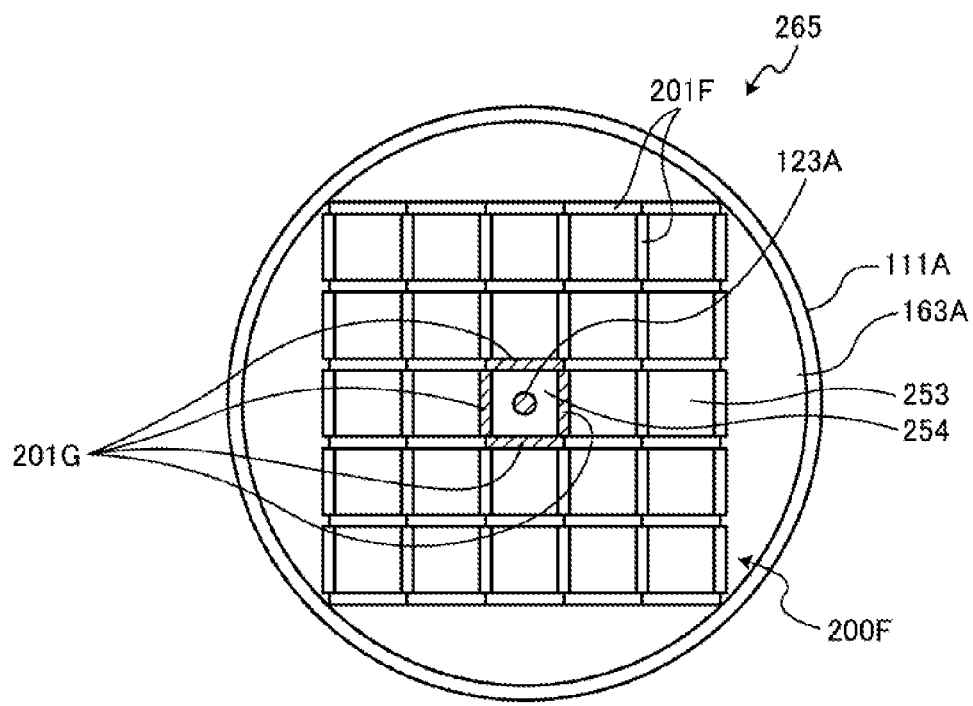
FIG. 22 is a plan view illustrating an example of the configuration of a dielectric window and a resonator array structure according to a fourth embodiment when seen from below.

FIG. 22 is a plan view illustrating an example of the configuration of a dielectric window and a resonator array structure according to a fourth embodiment when seen from below. In FIG. 22, the lower surface of the microwave transmitting plate 163A, which is the dielectric window and occupies most of the upper wall 111A, has a disk shape. The gas introduction nozzle 123A is located at the center of the microwave transmitting plate 163A. As shown in FIG. 22, in the resonator array structure (metamaterial) 200F, cells 253 surrounded by meta-atoms 201F are formed in five columns in the X-axis direction and in five rows in the Y-axis direction. Further, in the metamaterial 200F, the gas introduction nozzle 123A is disposed, and the cell 254 surrounded by a non-resonant meta-atom 201G is formed at the center. In other words, the cells 253 and 254 are arranged in a 5×5 square array 265. In the array 265, the length of the diagonal of the rectangle of the metamaterial 200F is equal to or less than the diameter of the microwave transmitting plate 163A. Therefore, all the cells 253 and 254 are within the range of the microwave transmitting plate 163A.

According to the fourth embodiment, in each cell 253, the meta-atom 201F resonates with the frequency output from the microwave output portion 130 to generate plasma. However, since the cell 254 is surrounded by meta-atoms 201G that do not resonate with the frequency output from the microwave output portion 130, plasma is not generated. Further, since the plasma generated in each cell 253 is confined in each cell 220, it is possible to suppress the plasma from spreading to the inside of the cell 254 and the outside of the metamaterial 200F in a horizontal direction. That is, in the fourth embodiment, plasma generation may be suppressed near the gas introduction nozzle 123A and near the side wall. Although it is described in the fourth embodiment that the plasma processing apparatus has one microwave radiation mechanism 143, the present disclosure may be applied to a plasma processing apparatus which has a plurality of microwave radiation mechanisms 143 and in which a gas introduction nozzle 123A is disposed at the center of each microwave transmitting plate 163.

Fifth Embodiment

In the above-described first embodiment, the cells 220 are divided by the meta-atom 201. However, the meta-atom may be provided with a through hole to ensure the continuity of plasma between neighboring cells. This will be described as the fifth embodiment. Since the plasma processing apparatus of the fifth embodiment remains the same as that of the above-described first embodiment except for the through hole of the metamaterial, a duplicated description of the configuration and operation will be omitted.

Figure 23:
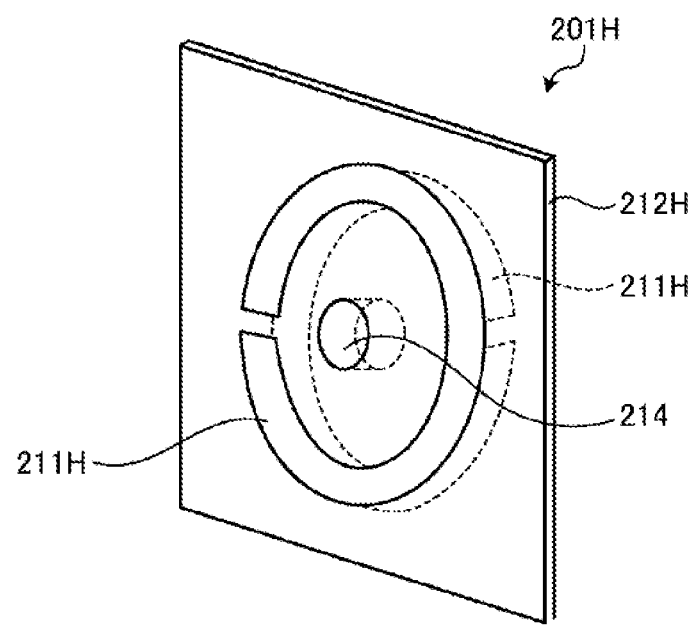
FIG. 23 is a diagram illustrating an example of the configuration of a card-shaped resonator according to a fifth embodiment.

FIG. 23 is a diagram illustrating an example of the configuration of a card-shaped resonator according to the fifth embodiment. The card-shaped resonator (meta-atom) 201H shown in FIG. 23 has a structure in which two C-shaped ring members 211H made of conductors are arranged, and a dielectric plate 212H is interposed between the ring members 211H arranged adjacent to each other in opposite directions. That is, in the meta-atom 201H, the dielectric plate 212H is inserted between two C-shaped ring members 211H facing in opposite directions. The capacitor equivalent elements are formed on the opposing surfaces of the two C-shaped ring members 211H or both ends of each ring member 211H, and the coil equivalent element is formed along each ring member 211H. Thereby, the meta-atom 201H may form a series resonant circuit. Further, the meta-atom 201H has on the center a through hole 214. By providing the through hole 214, gas or plasma may flow in and out of the cell formed of the meta-atom 201H between adjacent cells. The card-shaped resonator 201H may be expressed as being formed into a card shape for each set of two C-shaped ring members 211H.

Figure 24:
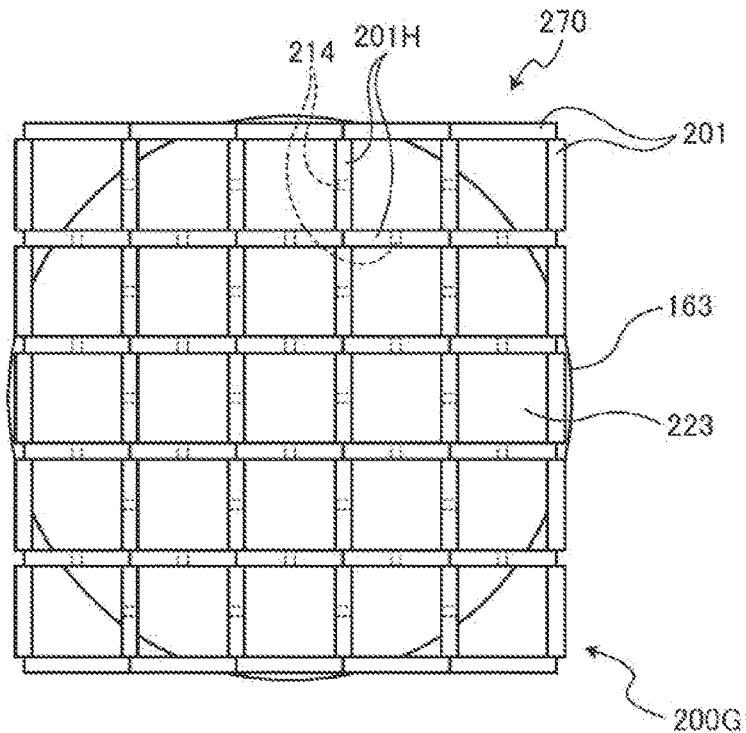
FIG. 24 is a plan view illustrating an example of the configuration of a dielectric window and a resonator array structure according to the fifth embodiment when seen from below.

FIG. 24 is a plan view illustrating an example of the configuration of a dielectric window and a resonator array structure according to the fifth embodiment when seen from below. In FIG. 24, the lower surface of one of a plurality of microwave transmitting plates 163, which are dielectric windows, has a disk shape. As shown in FIG. 24, a resonator array structure (metamaterial) 200G has on an outer periphery thereof the meta-atom 201 that is the same as the first embodiment, with a meta-atom 201H arranged therein. In the metamaterial 200G, cells 223 surrounded by the meta-atoms 201 and 201H are formed in five columns in the X-axis direction and in five rows in the Y-axis direction. In other words, the cells 223 are arranged in a 5×5 square array 270. In the array 270, the diameter of the microwave transmitting plate 163 is substantially equal to the length of one side of the metamaterial 200G. Therefore, the cells 223 of the peripheral portion are arranged across the microwave transmitting plate 163 and the upper wall 111 except for some cells 223 (1st row and 3rd column, 3rd row and 1st column, 3rd row and 5th column, 5th row and 3rd column).

In the first embodiment, when the meta-atom 201 resonates with the frequency output from the microwave output portion 130 and plasma ignites, the shape of a magnetic field entering each cell 220 is changed depending on the temporal change of the microwave or the timing of a pulse, so a cell 220 that does not ignite may occur. Once the state is stabilized after the plasma ignites, it is intended to be maintained as it is. Thus, cells that are not ignited (discharged) may remain in an unignited state. The unignited cells may degrade the uniformity of plasma processing.

On the other hand, in the array 270 of the fifth embodiment, the plasma spreads from the cell 223 where the plasma is ignited through the through hole 214 to an adjacent cell 223, so that the plasma is easily ignited even in the unignited cell 223. In other words, in the array 270, the unignited cell 223 is ignited in a plasma-assisted manner (chain reaction) using the plasma of the ignited cell 223. Since meta-atoms 201 having no through hole 214 are arranged on the outermost periphery of the metamaterial 200G, it is possible to suppress the plasma from spreading horizontally from the metamaterial 200G. Further, in the fifth embodiment, it is possible to improve the uniformity of plasma of each cell 223. In other words, according to the fifth embodiment, the high-density plasma can be generated and in-plane uniformity with respect to the substrate W can be improved. In addition, by combining the array of the meta-atoms 201 and 201H, the plasma density may be controlled to be changed between central and peripheral portions.

[Modifications 7 and 8 of Resonator Array Structure]

Figure 25:
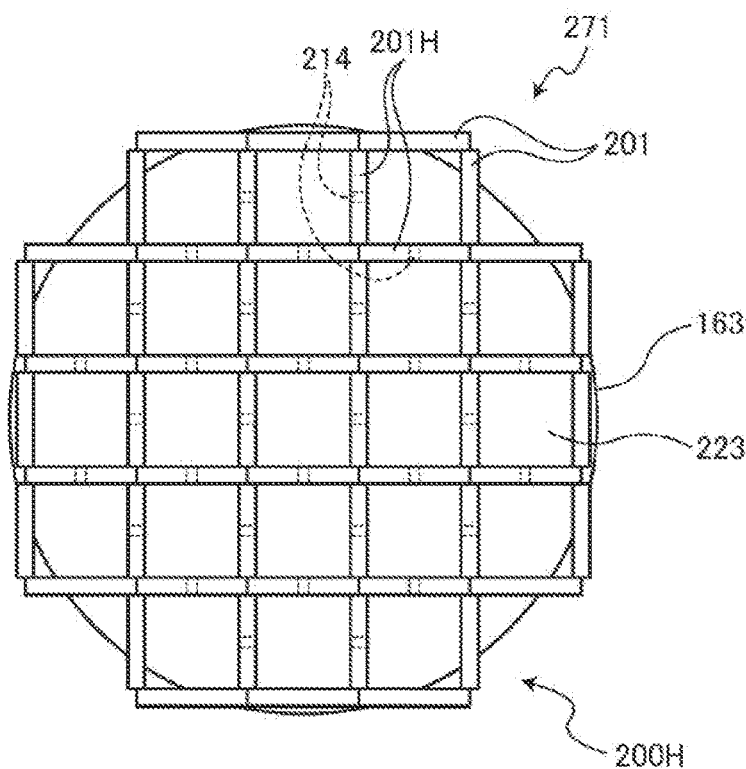
FIG. 25 is a diagram illustrating an example of the arrangement of card-shaped resonators according to modification 7.

Here, as modifications 7 and 8 of the array of the resonator array structure (metamaterial) 200G, variations in the array of the meta-atoms 201 and 201H will be described. FIG. 25 is a diagram illustrating an example of the arrangement of card-shaped resonators according to modification 7. The metamaterial 200H shown in FIG. 25 has an array 271 obtained by removing four corner cells 223 from the array 270 shown in FIG. 24. In the array 271, the new outermost metal-atom 201H in some of the cells 223 of the peripheral portion (1st row and 2nd column, 1st row and 4th column, 2nd row and 1st column, 2nd row and 5th column, 4th row and 1st column, 4th row and 5th column, 5th row and 2nd column, and 5th row and 4th column) is changed to the meta-atom 201 having no through hole 214. Further, in the array 271, a portion of the microwave transmitting plate 163 is located outside the metamaterial 200H. Further, in the array 271, some of the cells 223 of the peripheral portion (1st row and 2nd column, 1st row and 4th column, 2nd row and 1st column, 2nd row and 5th column, 4th row and 1st column, 4th row and 5th column, 5th row and 2nd column, and 5th row and 4th column) are arranged across the microwave transmitting plate 163 and the upper wall 111.

Figure 26:
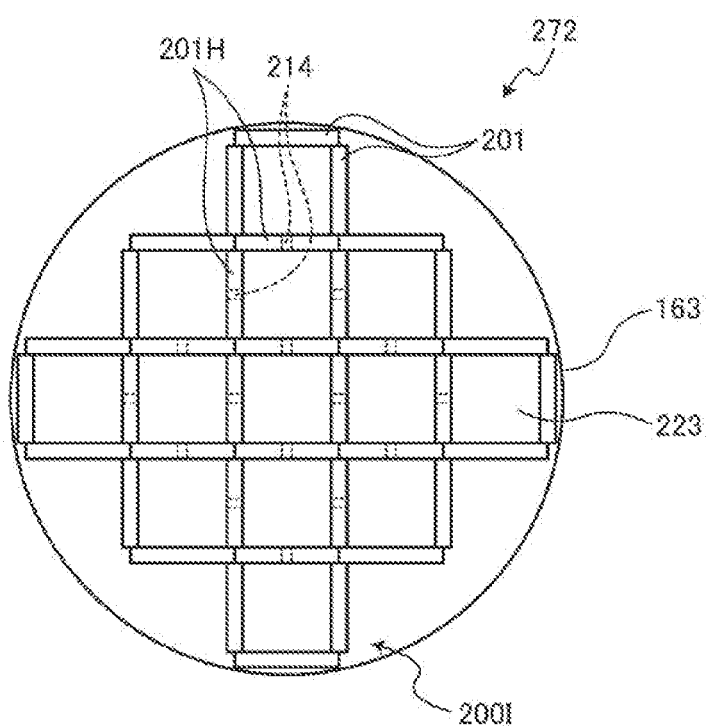
FIG. 26 is a diagram illustrating an example of the arrangement of card-shaped resonators according to modification 8.

FIG. 26 is a diagram illustrating an example of the arrangement of card-shaped resonators according to modification 8. The metamaterial 200I shown in FIG. 26 has an array 272 obtained by further removing some of the cells 223 of the peripheral portion (1st row and 2nd column, 1st row and 4th column, 2nd row and 1st column, 2nd row and 5th column, 4th row and 1st column, 4th row and 5th column, 5th row and 2nd column, and 5th row and 4th column) from the array 271 shown in FIG. 25. In the array 272, the new outermost metal-atom 201H in the cells 223 of the peripheral portion (1st row and 3rd column, 2nd row and 2nd column, 2nd row and 4th column, 3rd row and 1st column, 3rd row and 5th column, 4th row and 2nd column, 4th row and 4th column, and 5th row and 3rd column) is changed to the meta-atom 201 having no through hole 214. In the array 272, a portion of the microwave transmitting plate 163 is located outside the metamaterial 200I. In the array 272, there is no cell 223 arranged across the microwave transmitting plate 163 and the upper wall 111. Thus, the arrangement of the meta-atoms 201 and 201H may be changed depending on, for example, the high-frequency power for generating plasma.

(Other Modifications)

Further, in each embodiment, the metamaterials 200, 200A to 200I are formed by arranging in a grid shape the plurality of meta-atoms 201, 201C to 201H that are capable of resonance with the magnetic field component of the microwave and are smaller in size than the wavelength of the microwave. This case has been described as an example. The arrangement of the plurality of meta-atoms 201, 201C to 201H is not limited thereto, and may be any arrangement such as a triangular or hexagonal arrangement. Further, for example, the plurality of meta-atoms 201, 201C to 201H may be arranged at predetermined intervals along one direction. Further, the meta-atoms may be horizontally long rectangular meta-atoms in which the plurality of meta-atoms 201, 201C to 201H are connected horizontally. For example, by combining the rectangular meta-atoms vertically and horizontally, a grid-like cell may be formed.

As described above, according to each embodiment, the plasma processing apparatus 100 includes the processing chamber 101, the microwave generator (microwave output portion 130), the plurality of microwave radiators (microwave radiation mechanism 143), the plurality of microwave transmission windows (microwave transmitting plate 163), and the plurality of resonator array structures (metamaterial) 200. The processing chamber 101 accommodates the substrate W, and defines the processing space S by the upper wall 111, the side wall 112, and the lower wall 113. The microwave generator is configured to generate the microwave for generating the plasma. The microwave radiator is provided above the upper wall 111, and is configured to radiate the microwave toward the processing chamber 101. The microwave transmission window is provided at a position corresponding to each of the plurality of microwave radiators on the upper wall 111, and is the microwave transmission window formed of the dielectric. The resonator array structure 200 is disposed on the lower surface of each of the plurality of microwave transmission windows, and is formed by arranging the plurality of resonators (meta-atoms 201) that are capable of resonance with the magnetic field component of the microwave and are smaller in size than the wavelength of the microwave. As a result, interference between the plurality of microwave radiators can be suppressed. Further, it is possible to suppress damage to the gas introduction nozzle 123 or the side wall 112 due to the plasma.

Further, according to the first, third to fifth embodiments, the plurality of resonator array structures 200, 200A to 200I are individually formed. As a result, each of the resonator array structures 200, 200A to 200I may be replaced.

According to the second embodiment, the plurality of resonator array structures 200 are integrally formed. As a result, each resonator array structure 200 may be easily installed on the upper wall 111.

Further, according to the first, second, and fifth embodiments, in the resonator array structures 200, 200G to 200I, some of the cells 220 and 223 surrounded by the plurality of resonators are formed to the outside of the microwave transmission window. As a result, it is possible to suppress the plasma from spreading horizontally from the metamaterials 200, 200G to 200I.

According to the third and fourth embodiments, the resonator array structures 200D and 200F are formed such that the cells 250, 253, and 254 surrounded by the plurality of resonators are fitted inside the microwave transmission window. As a result, the plasma density between the cells 250 and 253 can be made uniform.

According to each embodiment, the cells 220 to 223 and 250 to 254 are formed in a grid shape. As a result, high-density plasma can be achieved over a wide range.

Further, according to modifications 3 and 6, in the resonator array structures 200C and 200E, the resonant frequency of the outermost resonator of the plurality of resonators (meta-atoms 201C and 201E) is a frequency that does not resonate with the microwave. For example, when the resonant frequency fr of other resonators that resonate with the microwave is about 2.35 GHz, the resonant frequency of the outermost resonator of the plurality of resonators is a resonant frequency fr (=about 2.15 GHz or about 2.55 GHz) separated by ±0.2 GHz, for example. As a result, it is possible to suppress interference between the plurality of microwave radiators.

According to each embodiment, the resonator has a size less than ¹⁄₁₀ of the microwave wavelength. As a result, high-density plasma can be achieved over a wide range.

According to the fourth embodiment, the plasma processing apparatus further includes on the upper wall 111A a gas nozzle (gas introduction nozzle 123A) that introduces gas for generating the plasma into the processing chamber. In the resonator array structure 200F, the resonant frequency of the resonator (meta-atom 201G) on the gas nozzle side is a frequency that does not resonate with the microwave. For example, when the resonant frequency fr of other resonators that resonate with the microwave is approximately 2.35 GHz, the resonant frequency of the resonator on the gas nozzle side is, for example, the resonant frequency fr (=approximately 2.15 GHz or approximately 2.55 GHz) separated by ±0.2 GHz. As a result, it is possible to suppress damage to the gas introduction nozzle 123A due to the plasma.

According to the fifth embodiment, the resonator array structures 200G to 200I have the through hole 214 in the resonator (meta-atom 201H) adjacent to another cell 223 in the cell 223 surrounded by the plurality of resonators. As a result, the in-plane uniformity of plasma can be improved.

It should be noted that each embodiment disclosed herein is illustrative in all respects but is not restrictive. Each embodiment may be omitted, substituted, or modified in various forms without departing from the scope and spirit of the appended claims.

Although the plasma processing apparatus 100 having the plurality of microwave radiation mechanisms 143 and the metamaterials 200, 200A to 200E, and 200G to 200I has been described in the first to third and fifth embodiments, the present disclosure is not limited thereto. For instance, as in the fourth embodiment, the first to third and fifth embodiments may be combined into the plasma processing apparatus having one microwave radiation mechanism 143.

It should be noted that the present disclosure can also have the following configuration.

(1)

A plasma processing apparatus, comprising:
- a processing chamber accommodating a substrate, and defining a processing space by an upper wall, a side wall, and a lower wall;
- a microwave generator configured to generate a microwave for generating plasma;
- a plurality of microwave radiators provided above the upper wall, and configured to radiate the microwave toward the processing chamber;
- a plurality of microwave transmission windows provided at positions corresponding to the plurality of microwave radiators in the upper wall, and formed of a dielectric; and
- a plurality of resonator array structures disposed on lower surfaces of the plurality of microwave transmission windows, respectively, and formed by arranging a plurality of resonators that are capable of resonance with a magnetic field component of the microwave and are smaller in size than a wavelength of the microwave.

(2)

The plasma processing apparatus of (1), wherein each of the plurality of resonator array structures is individually formed.

(3)

The plasma processing apparatus of (1), wherein the plurality of resonator array structures are integrally formed.

(4)

The plasma processing apparatus of any one of (1) to (3), wherein, in the resonator array structure, a portion of cells surrounded by the plurality of resonators extends to an outside of the microwave transmission window.

(5)

The plasma processing apparatus of any one of (1) to (3), wherein the resonator array structure is formed such that cells surrounded by the plurality of resonators are formed to be inside the microwave transmission window.

(6)

The plasma processing apparatus of (4) or (5), wherein the cells are formed in a grid shape.

(7)

The plasma processing apparatus of any one of (1) to (6), wherein, in the resonator array structure, a resonant frequency of an outermost resonator of the plurality of resonators is a frequency that does not resonate with the microwave.

(8)

The plasma processing apparatus of any one of (1) to (7), wherein the resonator has a size less than $1/10$ of the wavelength of the microwave.

(9)

The plasma processing apparatus of any one of (1) to (8), further comprising:
 a gas nozzle formed on the upper wall to introduce a gas for generating the plasma into the processing chamber,
  wherein, in the resonator array structure, a resonant frequency of a resonator on a gas nozzle side is a frequency that does not resonate with the microwave.

(10)

The plasma processing apparatus of any one of (1) to (9), wherein the resonator array structure comprises a through hole in a resonator adjacent to another cell in a cell surrounded by the plurality of resonators.

The invention claimed is:

1. A plasma processing apparatus, comprising:
 a processing chamber accommodating a substrate, and defining a processing space by an upper wall, a side wall, and a lower wall;
 a microwave generator configured to generate a microwave for generating plasma;
 a plurality of microwave radiators provided above the upper wall, and configured to radiate the microwave toward the processing chamber;
 a plurality of microwave transmission windows provided at positions corresponding to the plurality of microwave radiators in the upper wall, and formed of a dielectric; and
 a plurality of resonator array structures disposed on lower surfaces of the plurality of microwave transmission windows, respectively, and formed by arranging a plurality of resonators that are capable of resonance with a magnetic field component of the microwave and are smaller in size than a wavelength of the microwave.

2. The plasma processing apparatus of claim 1, wherein each of the plurality of resonator array structures is individually formed.

3. The plasma processing apparatus of claim 1, wherein the plurality of resonator array structures are integrally formed.

4. The plasma processing apparatus of claim 1, wherein, in the resonator array structure, a portion of cells surrounded by the plurality of resonators extends to an outside of the microwave transmission window.

5. The plasma processing apparatus of claim 4, wherein the cells are formed in a grid shape.

6. The plasma processing apparatus of claim 1, wherein the resonator array structure is formed such that cells surrounded by the plurality of resonators are formed to be inside the microwave transmission window.

7. The plasma processing apparatus of claim 6, wherein the cells are formed in a grid shape.

8. The plasma processing apparatus of claim 1, wherein, in the resonator array structure, a resonant frequency of an outermost resonator of the plurality of resonators is a frequency that does not resonate with the microwave.

9. The plasma processing apparatus of claim 1, wherein the resonator has a size less than $1/10$ of the wavelength of the microwave.

10. The plasma processing apparatus of claim 1, further comprising:
 a gas nozzle formed on the upper wall to introduce a gas for generating the plasma into the processing chamber,
  wherein, in the resonator array structure, a resonant frequency of a resonator on a gas nozzle side is a frequency that does not resonate with the microwave.

11. The plasma processing apparatus of claim 1, wherein the resonator array structure comprises a through hole in a resonator adjacent to another cell in a cell surrounded by the plurality of resonators.

* * * * *